(12) United States Patent
Shaharabany et al.

(10) Patent No.: US 10,126,970 B2
(45) Date of Patent: Nov. 13, 2018

(54) PAIRED METABLOCKS IN NON-VOLATILE STORAGE DEVICE

(71) Applicant: SanDisk Technologies LLC, Plano, TX (US)

(72) Inventors: Amir Shaharabany, Yair (IL); Hadas Oshinsky, Kfar Saba (IL); Yacov Duzly, Ra'anana (IL); James Fitzpatrick, Sudbury, MA (US)

(73) Assignee: SanDisk Technologies LLC, Plano, TX (US)

( * ) Notice: Subject to any disclaimer, the term of this patent is extended or adjusted under 35 U.S.C. 154(b) by 232 days.

(21) Appl. No.: 15/348,875

(22) Filed: Nov. 10, 2016

(65) Prior Publication Data

US 2017/0168716 A1 Jun. 15, 2017

Related U.S. Application Data

(60) Provisional application No. 62/266,512, filed on Dec. 11, 2015.

(51) Int. Cl.
G06F 11/00 (2006.01)
G06F 3/06 (2006.01)
G06F 11/07 (2006.01)

(52) U.S. Cl.
CPC ............ G06F 3/064 (2013.01); G06F 3/0616 (2013.01); G06F 3/0679 (2013.01);
(Continued)

(58) Field of Classification Search
CPC ...... G06F 3/064; G06F 3/0679; G06F 3/0616; G06F 11/0727; G06F 11/0751;
(Continued)

(56) References Cited

U.S. PATENT DOCUMENTS 4,586,167 A 4/1986 Fujishima et al.
5,559,988 A 9/1996 Durante et al.
(Continued)

FOREIGN PATENT DOCUMENTS

EP 0 376 285 A2 7/1990
WO WO 2012/083308 6/2012

OTHER PUBLICATIONS

Atmel Data-sheet, "9-to-bit Selectable, ±0.5° C. Accurate Digital Temperature Sensor with Nonvolatile Registers and Serial EEPROM" www.atmel.com/images/Atmel-8854-DTS-AT30TSE752A-754A-758A-Datasheet.pdf, Atmel Data-sheet, Mar 1, 2011,—Atmel-8854-DTS-AT30TSE752A-754A-758A-Datasheet_102014, 57 pages.
(Continued)

Primary Examiner — Marc Duncan
(74) Attorney, Agent, or Firm — Brinks Gilson & Lione

(57) ABSTRACT

Systems, methods and/or devices are used to pair metablocks in a non-volatile storage device. In one aspect, a method of data organization of a memory device includes, writing data to and reading data from respective metablocks in a set of metablocks. The method further includes while performing said writing and reading: (1) accessing one or more management data structures in controller memory, identifying two or more metablock pairs; (2) accessing and updating metablock status information indicating which metablocks of the set of metablocks are closed, free and open; and (3) accessing and updating a valid count, corresponding to a number of sub-block memory units having valid data for each of a plurality of metablocks in the set of metablocks.

20 Claims, 17 Drawing Sheets

| MetaBlock ID | Paired MetaBlock ID | Die 1 | Die 2 | Die 3 | Die 4 |
|---|---|---|---|---|---|
| 100 | NULL | Block 100 | Block 200 | Block 300 | Block 400 |
| 101 | NULL | Block 101 | Block 201 | Block 301 | Block 401 |
| 102 | NULL | Block 102 | Block 202 | Block 302 | Block 402 |
| 103 | NULL | Block 103 | Block 203 | Block 303 | Block 403 |
| 104 | NULL | Block 104 | Block 204 | Block 304 | Block 404 |
| 105 | 110 | Block 105 | Block 205 | Block 305 | Block 405 |
| 106 | 109 | Block 106 | Block 206 | Block 306 | Block 406 |
| 107 | 108 | Block 107 | Block 207 | Block 307 | Block 407 |
| 108 | 107 | Block 108 | Block 208 | Block 308 | Block 407 |
| 109 | 106 | Block 109 | Block 209 | Block 306 | Block 406 |
| 110 | 105 | Block 110 | Block 205 | Block 305 | Block 405 |

(52) U.S. Cl.
CPC ........ *G06F 11/079* (2013.01); *G06F 11/0727* (2013.01); *G06F 11/0751* (2013.01); *G06F 11/0787* (2013.01)

(58) Field of Classification Search
CPC ............... G06F 11/0787; G06F 11/079; G06F 12/0246; G11C 16/16; G11C 29/24; G11C 29/82; G11C 29/886
See application file for complete search history.

(56) References Cited

U.S. PATENT DOCUMENTS

| | | | |
|---|---|---|---|
| 5,909,559 | A | 6/1999 | So |
| 6,247,136 | B1 | 6/2001 | MacWilliams et al. |
| 6,292,410 | B1 | 9/2001 | Yi et al. |
| 6,401,213 | B1 | 6/2002 | Jeddeloh |
| 6,449,709 | B1 | 9/2002 | Gates |
| 7,969,809 | B2 | 6/2011 | Ben-Rubi |
| 8,010,738 | B1 | 8/2011 | Chilton et al. |
| 8,095,765 | B2 * | 1/2012 | Asnaashari ......... G06F 12/0246 711/170 |
| 8,122,202 | B2 | 2/2012 | Gillingham |
| 8,213,255 | B2 | 7/2012 | Hemink et al. |
| 8,255,618 | B1 | 8/2012 | Borchers et al. |
| 8,321,627 | B1 | 11/2012 | Norrie et al. |
| 8,429,498 | B1 | 4/2013 | Anholt et al. |
| 8,479,080 | B1 | 7/2013 | Shalvi et al. |
| 8,539,139 | B1 | 9/2013 | Morris |
| 8,595,590 | B1 | 11/2013 | Vojcic et al. |
| 8,775,720 | B1 | 7/2014 | Meyer et al. |
| 8,825,967 | B2 | 9/2014 | Hong Beom |
| 8,832,507 | B2 * | 9/2014 | Post ................ G06F 11/1048 714/718 |
| 8,874,836 | B1 | 10/2014 | Hayes et al. |
| 8,886,872 | B1 | 11/2014 | Norrie |
| 8,924,661 | B1 | 12/2014 | Shachar et al. |
| 8,984,376 | B1 | 3/2015 | Norrie |
| 9,128,825 | B1 | 9/2015 | Albrecht et al. |
| 9,170,876 | B1 | 10/2015 | Bates et al. |
| 9,176,971 | B2 | 11/2015 | Shapiro |
| 9,214,965 | B2 | 12/2015 | Fitzpatrick et al. |
| 2003/0115403 | A1 | 6/2003 | Bouchard et al. |
| 2003/0122834 | A1 | 7/2003 | Mastronarde et al. |
| 2004/0117441 | A1 | 6/2004 | Liu et al. |
| 2005/0144361 | A1 | 6/2005 | Gonzalez et al. |
| 2005/0144363 | A1 * | 6/2005 | Sinclair ............... G06F 12/0246 711/103 |
| 2005/0144516 | A1 * | 6/2005 | Gonzalez ............ G06F 12/0246 714/6.13 |
| 2005/0248992 | A1 | 11/2005 | Hwang et al. |
| 2007/0002629 | A1 | 1/2007 | Lee et al. |
| 2007/0156998 | A1 | 7/2007 | Gorobets |
| 2007/0233937 | A1 | 10/2007 | Coulson et al. |
| 2008/0140914 | A1 | 6/2008 | Jeon |
| 2008/0147994 | A1 | 6/2008 | Jeong et al. |
| 2008/0235466 | A1 | 9/2008 | Traister |
| 2008/0235480 | A1 | 9/2008 | Traister |
| 2008/0295094 | A1 | 11/2008 | Korupolu et al. |
| 2009/0168525 | A1 | 7/2009 | Olbrich et al. |
| 2009/0177943 | A1 | 7/2009 | Silvus et al. |
| 2009/0222627 | A1 | 9/2009 | Reid |
| 2009/0282191 | A1 | 11/2009 | Depta |
| 2010/0005217 | A1 | 1/2010 | Jeddeloh |
| 2010/0014364 | A1 | 1/2010 | Laberge et al. |
| 2010/0082879 | A1 | 4/2010 | McKean et al. |
| 2010/0165730 | A1 | 7/2010 | Sommer et al. |
| 2010/0174845 | A1 | 7/2010 | Gorobets et al. |
| 2010/0174853 | A1 | 7/2010 | Lee et al. |
| 2010/0220509 | A1 | 9/2010 | Solokov et al. |
| 2010/0250874 | A1 | 9/2010 | Farrell et al. |
| 2011/0113204 | A1 | 5/2011 | Henriksson et al. |
| 2011/0138100 | A1 | 6/2011 | Sinclair |
| 2011/0235434 | A1 | 9/2011 | Byom et al. |
| 2011/0252215 | A1 | 10/2011 | Franceschini et al. |
| 2011/0264851 | A1 | 10/2011 | Jeon et al. |
| 2011/0302474 | A1 | 12/2011 | Goss et al. |
| 2012/0030408 | A1 | 2/2012 | Flynn et al. |
| 2012/0047317 | A1 | 2/2012 | Yoon et al. |
| 2012/0159070 | A1 | 6/2012 | Baderdinni et al. |
| 2012/0198129 | A1 | 8/2012 | Van Aken et al. |
| 2012/0224425 | A1 | 9/2012 | Fai et al. |
| 2012/0278530 | A1 | 11/2012 | Ebsen |
| 2012/0324180 | A1 | 12/2012 | Asnaashari et al. |
| 2013/0007380 | A1 | 1/2013 | Seekins et al. |
| 2013/0070507 | A1 | 3/2013 | Yoon |
| 2013/0111112 | A1 | 5/2013 | Jeong et al. |
| 2013/0111289 | A1 | 5/2013 | Zhang et al. |
| 2013/0111290 | A1 | 5/2013 | Zhang et al. |
| 2013/0132650 | A1 | 5/2013 | Choi et al. |
| 2013/0182506 | A1 | 7/2013 | Melik-Martirosian |
| 2013/0219106 | A1 | 8/2013 | Vogan et al. |
| 2013/0232290 | A1 | 9/2013 | Ish et al. |
| 2013/0254498 | A1 | 9/2013 | Adachi et al. |
| 2013/0262745 | A1 | 10/2013 | Lin et al. |
| 2013/0297894 | A1 | 11/2013 | Cohen et al. |
| 2013/0336059 | A1 * | 12/2013 | Lee ................. G11C 29/82 365/185.09 |
| 2013/0346805 | A1 | 12/2013 | Sprouse et al. |
| 2014/0006688 | A1 | 1/2014 | Yu et al. |
| 2014/0013026 | A1 | 1/2014 | Venkata et al. |
| 2014/0047170 | A1 | 2/2014 | Cohen et al. |
| 2014/0075100 | A1 | 3/2014 | Kaneko et al. |
| 2014/0143637 | A1 | 5/2014 | Cohen et al. |
| 2014/0164679 | A1 * | 6/2014 | Manohar ............ G11C 16/3495 711/103 |
| 2014/0173239 | A1 | 6/2014 | Schushan |
| 2014/0229655 | A1 | 8/2014 | Goss et al. |
| 2014/0229656 | A1 | 8/2014 | Goss et al. |
| 2014/0241071 | A1 | 8/2014 | Goss et al. |
| 2014/0244897 | A1 | 8/2014 | Goss et al. |
| 2014/0244899 | A1 | 8/2014 | Schmier et al. |
| 2014/0258598 | A1 | 9/2014 | Canepa et al. |
| 2014/0281833 | A1 | 9/2014 | Kroeger et al. |
| 2014/0310241 | A1 | 10/2014 | Goyen |
| 2014/0379988 | A1 | 12/2014 | Lyakhovitskiy et al. |
| 2015/0067172 | A1 | 3/2015 | Ashokan et al. |
| 2015/0074487 | A1 | 3/2015 | Patapoutian et al. |
| 2015/0095558 | A1 | 4/2015 | Kim et al. |
| 2015/0113206 | A1 | 4/2015 | Fitzpatrick et al. |
| 2015/0186278 | A1 | 7/2015 | Jayakumar et al. |
| 2015/0234612 | A1 | 8/2015 | Himelstein et al. |
| 2015/0261473 | A1 | 9/2015 | Matsuyama et al. |
| 2015/0262632 | A1 | 9/2015 | Shelton et al. |
| 2015/0301749 | A1 | 10/2015 | Seo et al. |
| 2015/0331627 | A1 | 11/2015 | Kwak |
| 2016/0026386 | A1 | 1/2016 | Ellis et al. |
| 2016/0034194 | A1 | 2/2016 | Brokhman et al. |
| 2016/0062699 | A1 | 3/2016 | Samuels et al. |
| 2016/0070493 | A1 | 3/2016 | Oh et al. |
| 2016/0071612 | A1 | 3/2016 | Takizawa et al. |
| 2016/0117099 | A1 | 4/2016 | Prins et al. |
| 2016/0117102 | A1 | 4/2016 | Hong et al. |
| 2016/0117105 | A1 | 4/2016 | Thangaraj et al. |
| 2016/0117252 | A1 | 4/2016 | Thangaraj et al. |
| 2016/0170671 | A1 | 6/2016 | Huang |
| 2016/0170831 | A1 | 6/2016 | Lesatre et al. |
| 2016/0179403 | A1 | 6/2016 | Kurotsuchi et al. |
| 2016/0210060 | A1 | 7/2016 | Dreyer |
| 2016/0299689 | A1 | 10/2016 | Kim et al. |
| 2016/0299699 | A1 | 10/2016 | Vanaraj et al. |
| 2016/0299704 | A1 | 10/2016 | Vanaraj et al. |
| 2016/0299724 | A1 | 10/2016 | Vanaraj et al. |
| 2016/0342344 | A1 | 11/2016 | Kankani et al. |
| 2016/0342345 | A1 | 11/2016 | Kankani et al. |
| 2016/0371394 | A1 | 12/2016 | Shahidi et al. |
| 2017/0228180 | A1 * | 8/2017 | Shen ................ G06F 3/0619 |

OTHER PUBLICATIONS

Seagate Technology, "SCSI Commands Reference Manual, Rev. C", Product Manual dated Apr. 2010, pp. 211-214.
Tanenbaum, "Structured Computer Organization", 3rd edition 1990, section 1.4, p. 11, 3 pages.

(56) References Cited

OTHER PUBLICATIONS

International Search Report and Written Opinion dated Nov. 18, 2015, received in International Patent Application No. PCT/US2015/039552 which corresponds to U.S. Appl. No. 14/559,183, 11 pages (Ellis).
International Search Report and Written Opinion dated Jul. 4, 2016, received in International Patent Application No. PCT/US2016/028477, which corresponds to U.S. Appl. No. 14/883,540, 11 pages (Hodgdon).
International Search Report and Written Opinion dated Nov. 9, 2015, received in International Patent Application No. PCT/US2015/053551, which corresponds to U.S. Appl. No. 14/668,690, 12 pages (Thangaraj).
International Search Report and Written Opinion dated Nov. 11, 2015, received in International Patent Application No. PCT/US2015/053582, which corresponds to U.S. Appl. No. 14/659,493, 12 pages (Prins).
International Search Report and Written Opinion dated Sep. 8, 2016, received in International Patent Application No. PCT/US2016/036716, which corresponds to U.S. No. 14/925.945, 13 pages (Ellis).

\* cited by examiner

Metablock Data Structure 226

| Metablock Structure Address | 0x1000 | 0x1008 | 0x1010 | 0x1018 | 0x1020 |
|---|---|---|---|---|---|
| Metablock ID | 104 | 105 | 110 | 107 | 108 |
| Block ID | 104, 204, 304, 404 | 105, 205, 305, 405 | 110, 205, 305, 405 | 107, 207, 307, 407 | 108, 208, 308, 407 |
| Valid Count | 4565 | 0 | 6594 | 2346 | 5879 |
| Paired Metablock | NULL | 0x1010 | 0x1008 | 0x1020 | 0x1018 |
| Current List | Open | Free | Closed | Open | Closed |

Figure 4B

Physical to Logical Mapping 238

| Physical Address | Logical Address | PE Count | Valid Count | Read Count | |
|---|---|---|---|---|---|
| 0x1000 | 0x2190 | 1450 | 4565 | 3184 | ⎯440-1 |
| 0x1008 | 0x4010 | 312 | 3569 | 2497 | ⎯440-2 |
| 0x1010 | 0x1288 | 224 | 6594 | 1465 | ⎯440-3 |
| 0x1018 | 0x8010 | 265 | 2346 | 2613 | ⎯440-4 |
| ⋮ | ⋮ | ⋮ | ⋮ | ⋮ | |

Figure 4C

PAIRED METABLOCKS IN NON-VOLATILE STORAGE DEVICE

RELATED APPLICATIONS

This application claims priority to U.S. Provisional Patent Application No. 62/266,512, filed Dec. 11, 2015, which is hereby incorporated by reference in its entirety.

TECHNICAL FIELD

The disclosed embodiments relate generally to storage systems, and in particular, to pairing metablocks in a non-volatile storage device (e.g., comprising one or more flash memory devices).

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Generally, flash memory devices include a plurality of flash memory die, and each die includes a plurality of memory blocks. In some systems, memory blocks are organized into the metablocks and the memory blocks in each metablock are accessed in parallel to optimize performance. However, the number of useable metablocks may be reduced by the presence of unusable blocks (e.g., blocks that cannot reliably stored data) in the flash memory die, which effectively reduces the amount of useable flash memory blocks by more than the number of unusable blocks.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to pair metablocks to increase the number of metablocks that are available for memory devices with memory die that have unusable blocks.

The disclosed device and method improves the endurance of non-volatile memory, such as flash memory, by increasing the number of metablocks that can be formed from blocks in a plurality of non-volatile memory die. As a result, more blocks and metablocks are available for use, which improves the actual or effective amount of over-provisioning (e.g., quantity or percentage of total storage capacity that is in excess of the declared capacity of the storage device), which in turn reduces write-amplification, and improves device endurance.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the pertinent features of the present disclosure and are therefore not to be considered limiting, for the description may admit to other effective features.

FIG. 3B is a block diagram of a plurality of die groups in accordance with some embodiments.

FIG. 3C is a block diagram of a die group mapping in accordance with some embodiments.

FIG. 4B illustrates a metablock data structure in accordance with some embodiments.

FIG. 4C illustrates a data structure for storing metadata, including valid data counts, for respective memory portions in a non-volatile memory device or system, in accordance with some embodiments.

Figure 1A:
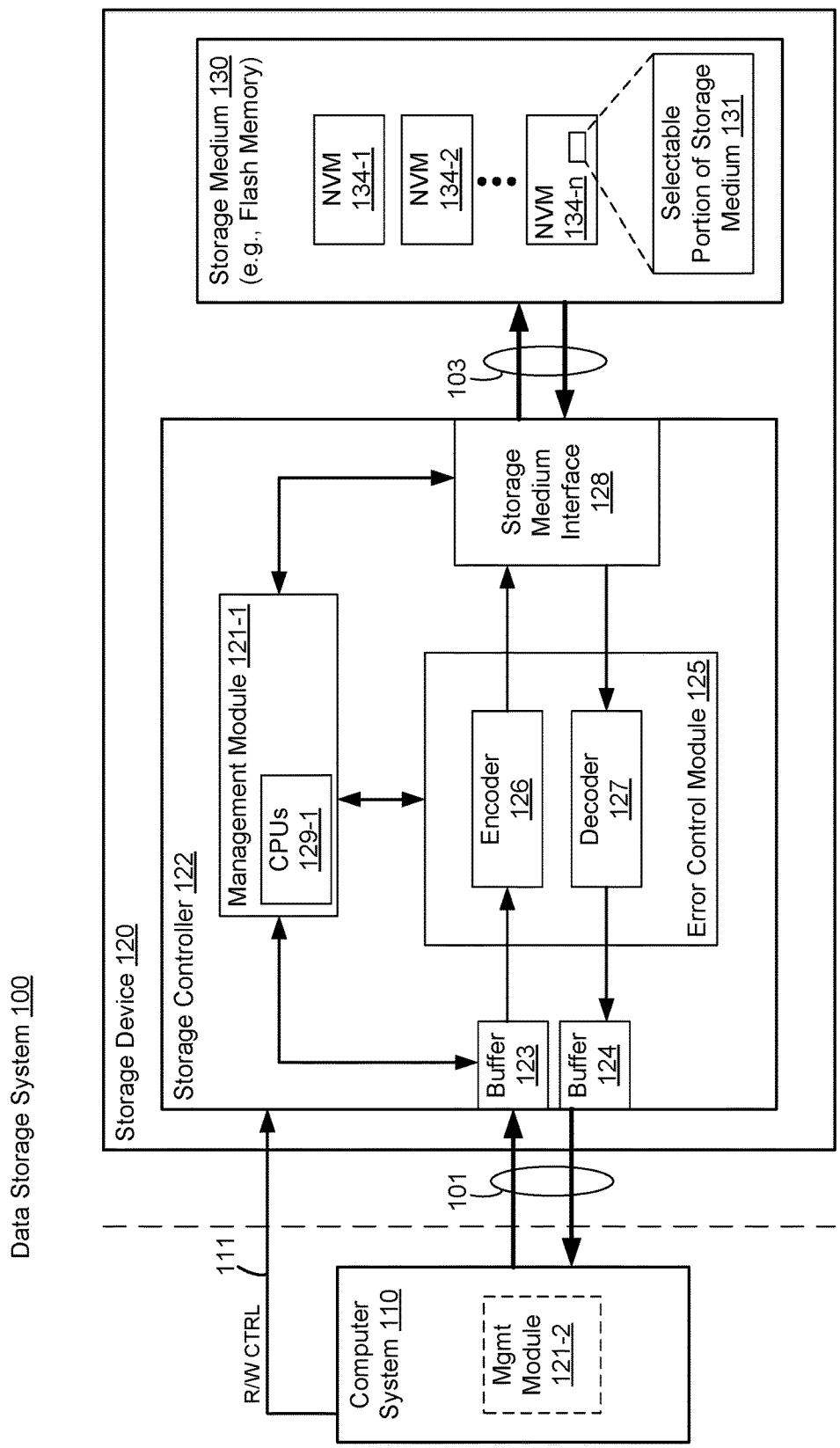
FIG. 1A is a block diagram illustrating an implementation of a data storage system in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable pairing metablocks in memory devices. Some implementations include systems, methods and/or devices to pair metablocks to increase the number of metablocks available when memory die include unusable blocks.

The various embodiments described herein include devices and/or methods that may improve the endurance of a storage medium, such as a flash memory. Some embodiments include devices and/or methods for managing the allocation of non-volatile memory blocks to metablocks in a storage system.

(A1) Some embodiments include a method of data organization of a memory device, the memory device including a plurality of memory die, each memory die including a plurality of memory blocks, each memory block including a plurality of memory pages, and a set of metablocks, each metablock including a specified set of N memory blocks in N different memory die, where N is an integer greater than 2. The set of metablocks include two or more metablock pairs, each metablock pair including a first metablock and a second metablock that share one or more individual memory blocks. The method includes: writing data to and reading data from respective metablocks in the set of metablocks. The method also includes, while performing said writing and reading: (1) accessing one or more management data structures in controller memory, distinct from the plurality of memory die, identifying two or more metablock pairs, (2) accessing and updating metablock status information indicating which metablocks of the set of metablocks are closed, free and open, and (3) accessing and updating a valid count, corresponding to a number of sub-block memory units having valid data, for each of a plurality of metablocks in the set of metablocks.

(A2) In some embodiments of the method of A1, the set of metablocks includes multiple unpaired metablocks, each unpaired metablock including a respective set of N memory blocks, none of which are included in any other metablock in the set of metablocks.

(A3) In some embodiments of the method of any of A1-2, the method further includes: (1) buffering write data in a write buffer, and (2) writing, in parallel, to a plurality of the memory blocks in a respective metablock in the set of metablocks, the write data in the write buffer.

(A4) In some embodiments of the method of any of A1-A3, the method further includes, in accordance with a determination that a block in a metablock pair fails a predefined health criterion: (1) identifying the metablock pair that includes the block that fails the predefined health criterion, and (2) updating information, stored in the one or more management data structures in controller memory, to identify, for a respective metablock of the two metablocks in the identified metablock pair, a modified set of memory blocks as the set of memory blocks included in the respective metablock of the metablocks in the identified metablock pair.

(A5) In some embodiments of the method of any of A1-A4, the method further includes, in accordance with detection of a trigger condition, with respect to an identified metablock pair: (1) copying all valid data in at least the first metablock of the identified metablock pair to new memory locations, and unmapping corresponding sub-block memory units in the first metablock, and (2) pairing the first metablock with another metablock other than the second metablock to form a new metablock pair.

(A6) In some embodiments of the method of A5, the trigger condition includes detection of a block, in at least one of the first metablock or second metablock, that fails a predefined health criterion, and the first metablock and other metablock in the new metablock pair do not include the block that failed the predefined health criterion.

(A7) In some embodiments of the method of any of A1-A6, the method further includes performing a garbage collection operation on at least one metablock of a respective metablock pair by: (1) selecting a closed metablock in accordance with a determination made using the valid count of the selected metablock, wherein the selected metablock is the first metablock of the respective metablock pair, (2) copying all valid data in the selected metablock to new memory locations and unmapping corresponding sub-block memory units in the selected metablock, wherein the unmapped sub-block memory units include one or more unmapped sub-block memory units in one or more blocks shared by the first metablock and second metablock of the respective metablock pair, (3) setting the valid count of the selected metablock to zero, and (4) updating the valid count of the second metablock in the respective metablock pair in accordance with the unmapped sub-block memory units in the one or more blocks shared by the first metablock and second metablock of the respective metablock pair.

(A8) In some embodiments of the method of A7, the method further includes, after performing the garbage collection operation on the at least one metablock of the respective metablock pair, opening the first metablock of the respective metablock pair, writing data to the first metablock of the respective metablock pair, wherein the written data includes data written to one or more blocks shared by the first metablock and second metablock of the respective metablock pair, and in accordance with said writing: (1) increasing a valid count of the first metablock of the respective metablock pair in accordance with a number of sub-blocks of the first metablock of the respective metablock pair to which data is written, and (2) increasing a valid count of the second metablock of the respective metablock pair in accordance with a number of sub-blocks of the one or more shared blocks to which data is written.

(A9) In some embodiments of the method of any of A1-A6, the method further includes opening the first metablock of a respective metablock pair, writing data to the first metablock of the respective metablock pair, wherein the written data includes data written to one or more blocks shared by the first metablock and second metablock of the respective metablock pair, and in accordance with said writing: (1) increasing a valid count of the first metablock of the respective metablock pair in accordance with a number of sub-blocks of the first metablock of the respective metablock pair to which data is written, and (2) increasing a valid count of the second metablock of the respective metablock pair in accordance with a number of sub-blocks of the one or more shared blocks to which data is written.

(A10) In some embodiments of the method of A9, the second metablock of the respective metablock pair remains closed while the first metablock of the respective metablock pair is open, the method further includes garbage collecting the second metablock of the respective metablock pair, and, in conjunction with garbage collecting the second metablock of the respective metablock pair: (1) updating the valid count for the second metablock of the respective metablock pair to zero, and (2) updating the valid count for the first metablock of the respective metablock pair to a value less than a value of the valid count prior to garbage collecting the second metablock of the respective metablock pair.

(A11) In some embodiments of the method of A10, updating the valid count for the first metablock of the respective metablock pair comprises reducing the valid count for the first metablock of the respective metablock pair by a quantity corresponding to an amount of data garbage collected from the one or more blocks shared by the first metablock and second metablock of the respective metablock pair.

(A12) In some embodiments of the method of any of A1-A11, the method further includes, in conjunction with formatting the memory device, placing unpaired metablocks in the set of metablocks on a free list of metablocks, placing paired metablocks in the set of metablocks on a closed list of metablocks, and successively selecting from the free list respective metablocks to which to write data.

(A13) In another aspect, a storage system includes (1) a plurality of memory die, each memory die including a plurality of memory blocks, each memory block including a plurality of memory pages, (2) a set of metablocks, each metablock including a specified set of N memory blocks in N different memory die, where N is an integer greater than 2, and the set of metablocks include two or more metablock pairs, each metablock pair including a first metablock and a second metablock that share one or more individual memory blocks, and (3) a controller having one or more processors and controller memory storing one or more programs, the one or more programs including instructions that when executed by the one or more processors cause the storage system to write data to and read data from respective metablocks in the set of metablocks. The one or more programs including instructions that when executed by the one or more processors also cause the storage system to, while performing said writing and reading: (1) access and update metablock status information indicating which metablocks of the set of metablocks are closed, free and open, and (2) access and update a valid count, corresponding to a number of sub-block memory units having valid data, for each of a plurality of metablocks in the set of metablocks.

(A14)) In some embodiments of the storage system of A13, the one or more programs include a metablock module having instructions for managing the metablock pairs, including maintaining valid counts of valid data in the metablock pairs when data is written to either metablock of any metablock pair and when data is garbage collected from either metablock of any metablock pair.

(A15) In some embodiments of the storage system of A13 or A14, the one or more programs, when executed by the one or more processors, cause the storage system to perform the method of any of A2-A12.

(A16) In another aspect, a storage system includes (1) a plurality of memory die, each memory die including a plurality of memory blocks, each memory block including a plurality of memory pages, (2) a set of metablocks, each metablock including a specified set of N memory blocks in N different memory die, where N is an integer greater than 2, and the set of metablocks include two or more metablock pairs, each metablock pair including a first metablock and a second metablock that share one or more individual memory blocks, and (3) a controller having one or more processors and controller memory storing one or more programs, the one or more programs including instructions that when executed by the one or more processors cause the storage system to perform or control performance of any of the methods A1 to A12 described herein.

(A17) In yet another aspect, any of the methods A1 to A12 described above are performed by a storage system including means for performing any of the methods described herein.

(A18) In yet another aspect, some embodiments include a non-transitory computer readable storage medium, storing one or more programs configured for execution by one or more processors of a storage device, the one or more programs including instructions for performing any of the methods described herein.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure pertinent aspects of the embodiments described herein.

FIG. 1A is a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120 (also sometimes called an information storage device, or a data storage device, or a memory device), which includes a storage controller 122 and a storage medium 130, and is used in conjunction with or includes a computer system 110 (e.g., a host system or a host computer). In some embodiments, storage medium 130 is a single flash memory device while in other embodiments storage medium 130 includes a plurality of flash memory devices. In some embodiments, storage medium 130 is NAND-type flash memory or NOR-type flash memory. In some embodiments, storage medium 130 includes one or more three-dimensional (3D) memory devices. Further, in some embodiments, storage controller 122 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, data storage system 100 includes one or more storage devices 120.

Computer system 110 is coupled to storage controller 122 through data connections 101. However, in some embodiments computer system 110 includes storage controller 122, or a portion of storage controller 122, as a component and/or as a subsystem. For example, in some embodiments, some or all of the functionality of storage controller 122 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch screen display, a mouse, a track-pad, a digital camera and/or any number of supplemental devices to add functionality to computer system 110. In some embodiments, computer system 110 does not have a display and other user interface components.

Storage medium 130 is coupled to storage controller 122 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 122 and storage medium 130 are included in the same device (i.e., an integrated device) as components thereof. Furthermore, in some embodiments storage controller 122 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices (e.g., NVM 134-1, NVM 134-2 through NVM 134-n) including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop and tablet computers.

Memory devices (e.g., NVM 134-1, NVM 134-2, etc.) of storage medium 130 include addressable and individually selectable blocks, such as selectable portion of storage medium 131 (also referred to herein as selected portion 131). In some embodiments, the individually selectable blocks (sometimes called erase blocks) are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some embodiments, storage controller 122 includes a management module 121-1, an input buffer 123, an output buffer 124, an error control module 125 and a storage medium interface (I/O) 128. Storage controller 122 may include various additional features that have not been illustrated for the sake of brevity and so as not to obscure pertinent features of the example embodiments disclosed herein, and that a different arrangement of features may be possible. Input and output buffers 123, 124, sometimes collectively called a host interface, provide an interface to computer system 110 through data connections 101. Similarly, storage medium I/O 128 provides an interface to storage medium 130 though connections 103. In some embodiments, storage medium I/O 128 includes read and write circuitry, including circuitry capable of providing reading signals to storage medium 130 (e.g., reading threshold voltages for NAND-type flash memory).

In some embodiments, management module 121-1 includes one or more processing units (sometimes herein called CPUs, processors, or hardware processors, and sometimes implemented using microprocessors, microcontrollers, or the like) 129-1 configured to execute instructions in one or more programs (e.g., in management module 121-1). In some embodiments, the one or more CPUs 129-1 are shared by one or more components within, and in some cases, beyond the function of storage controller 122. Management module 121-1 is coupled to input buffer 123, output buffer 124 (connection not shown), error control module 125 and storage medium I/O 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

Error control module 125 is coupled to storage medium I/O 128, input buffer 123, output buffer 124, and management module 121-1. Error control module 125 is provided to limit the number of uncorrectable errors inadvertently introduced into data (e.g., during writes to memory or reads from memory). In some embodiments, error control module 125 is executed in software by the one or more CPUs 129-1 of management module 121-1, and, in other embodiments, error control module 125 is implemented in whole or in part using special purpose circuitry to perform data encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands (e.g., via control line 111 or data connections 101) to storage controller 122 requesting data from storage medium 130. Storage controller 122 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some embodiments, if the decoding is not successful, storage controller 122 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, typically mean the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1" and otherwise the raw data value is a "0."

Figure 1B:
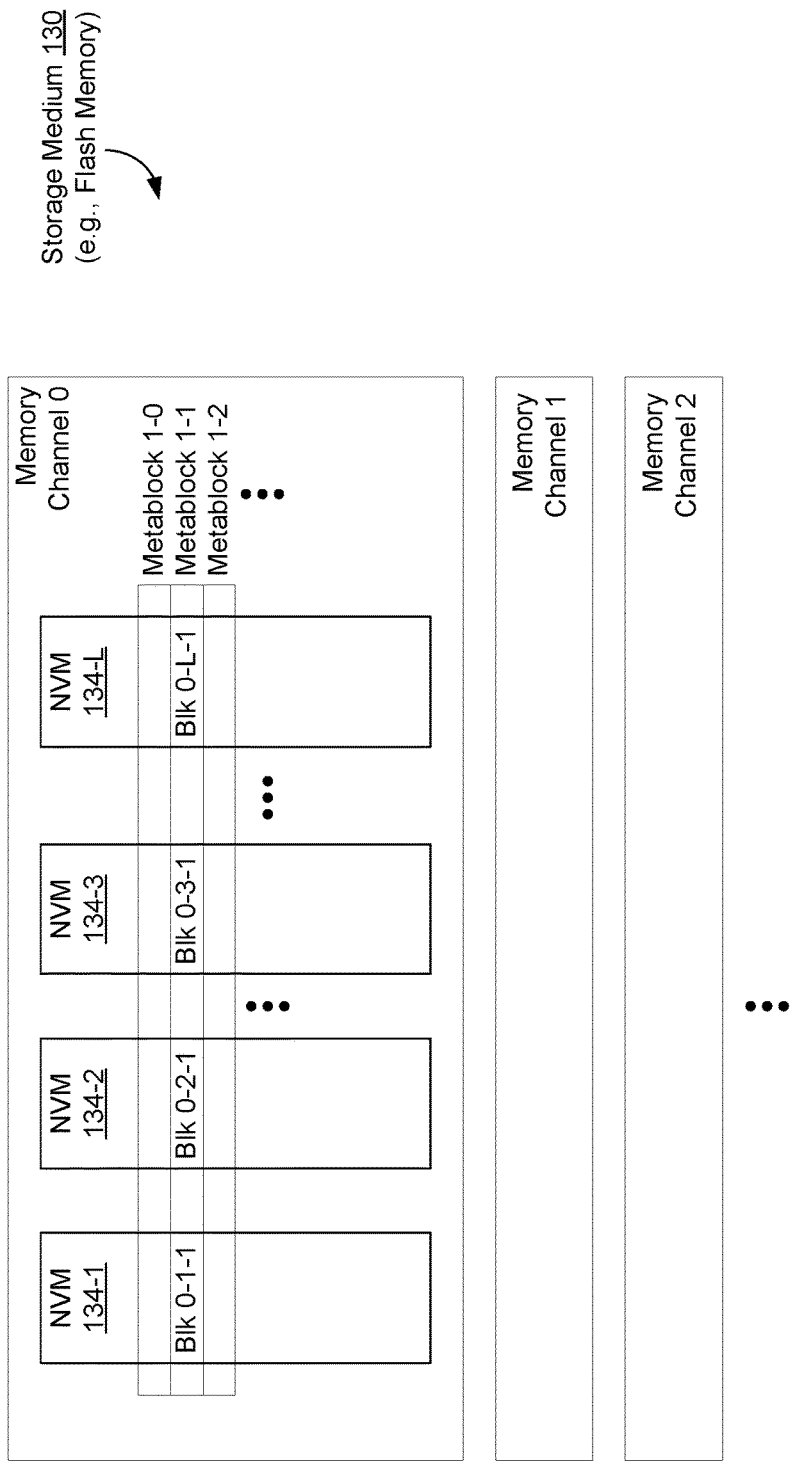
FIG. 1B is a block diagram illustrating an allocation of metablocks in a non-volatile memory system.

FIG. 1B is a block diagram illustrating an allocation of metablocks in a non-volatile memory system, in accordance with some embodiments. While some exemplary features are illustrated, various other features have not been illustrated for the sake of brevity and so as not to obscure pertinent aspects of the example implementations disclosed herein. To that end, as a non-limiting example, storage medium 130 includes one or more memory channels, and each memory channel includes a set of non-volatile memory devices, for example memory devices 134-1 through 134-L in memory channel 0 in the example shown in FIG. 1B.

Each memory device 134 typically is a single memory die, but optionally includes a plurality of memory die, each memory die including a plurality of memory blocks (e.g., Blk 0-1-1 through Blk 0-L-1). Metablocks are formed from sets of blocks from multiple non-volatile memory devices 134. For example, as illustrated in FIG. 1B, a metablock may be created by grouping blocks across memory die (e.g., Blk 0-1-1 through Blk 0-L-1) in a single memory channel, so that memory operations on the metablock can be performed in parallel. In some embodiments, a metablock could be a stripe across multiple memory devices (e.g., a RAID stripe). In some embodiments, each metablock includes a single block from each memory device 134 in a set of memory devices, such as the set of memory devices in a respective memory channel. In some other embodiments, each metablock includes two or more blocks from each memory device 134 in a set of memory devices. Although not illustrated in FIG. 1B, in some embodiments, metablocks are formed by allocating blocks from memory devices in each memory channel of a set of memory channels.

Typically, the number of metablocks that can be formed from the blocks in a set of memory devices is limited by the memory device, in a set of memory devices, having the fewest number of useable blocks. For example, in FIG. 1B, if memory device 134-1 were to have B useable blocks, memory device 134-2 were to have B-1 useable blocks, . . . and memory device 134-L were to have B-3 useable blocks, then the maximum number of metablocks that could be formed using conventional techniques (e.g., allocating blocks all having the same position or index in each memory device to the same metablock), would be B-3. In accordance with some embodiments described below, the number of metablocks that can be formed from the blocks in a set of memory devices is equal to the number of useable blocks in memory device having the maximum number of useable memory blocks.

Figure 2A:
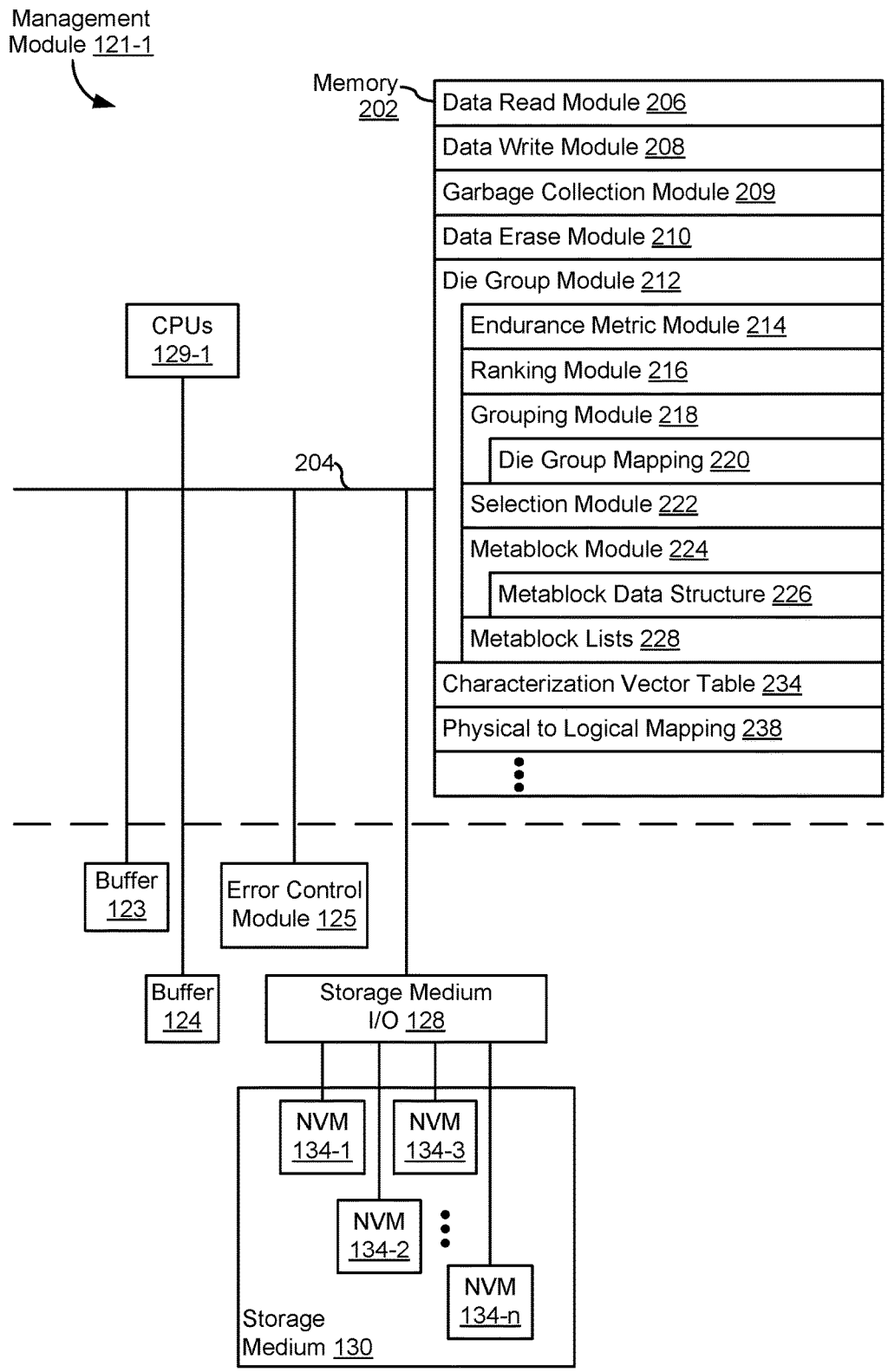
FIG. 2A is a block diagram illustrating an implementation of a management module in accordance with some embodiments.

FIG. 2A is a block diagram illustrating an exemplary management module 121-1 in accordance with some embodiments. Management module 121-1 typically includes: one or more processing units (CPUs) 129-1 for executing modules, programs and/or instructions stored in memory 202 (sometimes herein called controller memory) and thereby performing processing operations; memory 202; and one or more communication buses 204 for interconnecting these components. One or more communication buses 204, optionally, include circuitry (sometimes called a chipset) that interconnects and controls communications between system components. Management module 121-1 is coupled to buffer 123, buffer 124, error control module 125, and storage medium I/O 128 by one or more communication buses 204. Memory 202 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 202, optionally, includes one or more storage devices remotely located from the CPU(s) 129-1. Memory 202, or alternatively the non-volatile memory device(s) within memory 202, comprises a non-transitory computer readable storage medium. In some embodiments, memory 202, or the non-transitory computer readable storage medium of memory 202, stores the following programs, modules, and data structures, or a subset or superset thereof:

- data read module 206 for reading data from storage medium 130 comprising flash memory (e.g., one or more flash memory devices each comprising a plurality of die);
- data write module 208 for writing data to storage medium 130;
- garbage collection module 209 for controlling a garbage collection process in a storage medium (e.g., storage medium 130, FIG. 1A);
- data erase module 210 for erasing data from storage medium 130;
- die group module 212 for dividing storage medium 130 into a plurality of die groups and managing the plurality of die groups, including but not limited to:
  - endurance metric module 214 for obtaining an endurance metric for each of the plurality of die;

ranking module 216 for ranking the plurality of die based on their corresponding endurance metrics;

grouping module 218 for assigning the plurality of die to die groups based on their corresponding rankings, including die group mapping 220 associating logical addresses of die to a die group;

a selection module 222 for selecting a die group for a memory operation;

a metablock module 224 for managing metablocks, each including a plurality of blocks, including storing and updating storing information, in a metablock data structure 226, for the metablocks being managed; and metablock lists 228 for assigning each metablock to one of a free, open, or closed list corresponding to the availability of the metablock for receiving and storing write data.

characterization vector table 234 that includes a collection of characterization vectors 236 each storing characterization data for a respective portion of storage medium 130 (e.g., a flash memory device, die, block zone, block, word line, word line zone or page portion of storage medium 130); and physical to logical mapping 238 associating logical addresses with physical addresses and other metadata for respective portions of storage medium 130 (e.g., a distinct flash memory device, die, block zone, block, word line, word line zone or page portion of storage medium 130).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 202 may store a subset of the modules and data structures identified above. Furthermore, memory 202 may store additional modules and data structures not described above. In some embodiments, the programs, modules, and data structures stored in memory 202, or the non-transitory computer readable storage medium of memory 202, provide instructions for implementing any of the methods described below with reference to FIGS. 5A-5B and 6A-6F.

Although FIG. 2A shows a management module 121-1, FIG. 2A is intended more as functional description of the various features which may be present in a management module than as a structural schematic of the embodiments described herein. In practice, and as recognized by those of ordinary skill in the art, the programs, modules, and data structures shown separately could be combined and some programs, modules, and data structures could be separated.

Figure 2B:
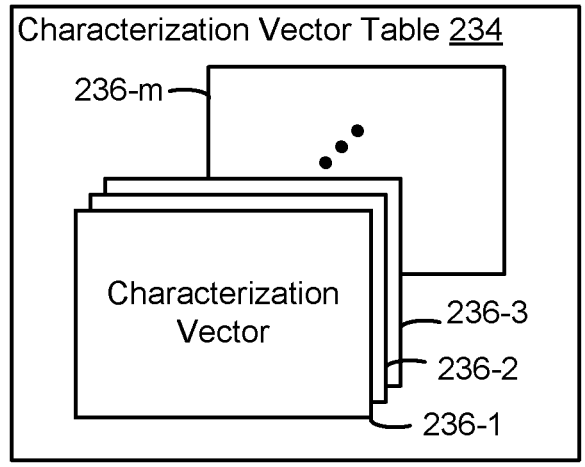
FIG. 2B is a diagram illustrating a characterization vector table included in FIG. 2A in accordance with some embodiments.

FIG. 2B is a block diagram illustrating an implementation of a characterization vector table 234 in accordance with some embodiments. Characterization vector table 234 includes a collection of characterization vectors 236, that each store characterization data associated with a respective portion of a storage medium 130 (e.g., a distinct device, die, block zone, block, word line, word line zone or page portion of storage medium 130). In some embodiments, each vector (e.g., vector 236-1, vector 236-2, . . . , vector 236-$m$) in the collection of characterization vectors 236 stores characterization data derived during each of at least two time periods (e.g., time T-1 and time T-2, or X program-erase (PE) cycles and 2X PE cycles). In some embodiments, the characterization data stored in characterization vectors 236 is statistically derived. For example, without limitation, in some embodiments in which a storage medium 130 (FIG. 1A) (e.g., one or more flash memory devices, each comprising a plurality of die) includes a plurality of die, characterization vector table 234 includes at least one characterization vector for each die. In another example, in some embodiments, characterization vector table 234 includes a set of distinct characterization vectors 236 for each die in storage medium 130, and the set of distinct characterization vectors 236 for each die includes at least one distinct characterization vector for each block in the die. More detailed example embodiments of characterization vectors 236 are described below with reference to FIG. 2C.

Figure 2C:
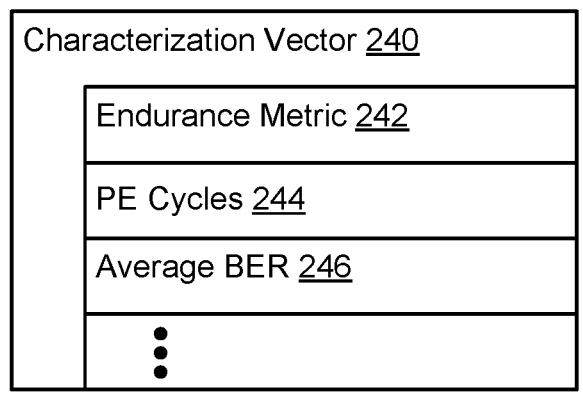
FIG. 2C is a diagram illustrating a characterization vector included in FIG. 2B in accordance with some embodiments.

FIG. 2C is a schematic diagram of an implementation of a characterization vector 240 (e.g., corresponding to one of characterization vectors 236 shown in FIG. 2B) for a respective die of the plurality of die in accordance with some embodiments. In some embodiments, characterization data stored in characterization vector 240 for the respective die includes storage medium characterization parameter values such as an endurance metric field 242 indicating the endurance capabilities of the respective die (e.g., a number of program-erase (PE) cycles sustained by a representative block within the respective die during a calibration routine), a PE cycles field 244 indicating a current count of the number of PE cycles performed on the respective die (e.g., the average PE cycles count for blocks in the die, or a total PE cycles count for all blocks in the die), and an average bit error rate (BER) 246 indicating an average BER of one or more blocks within the respective die. In some embodiments, the one or more storage medium characterization parameter values provide an indication of at least one of: a physical characteristic associated with the respective portion the storage medium (e.g., a distinct flash memory device, die, block zone, block, word line, word line zone or page portion of storage medium 130, FIG. 1A), a mode of operation associated with the respective portion of the storage medium, a history of use associated with the respective portion of the storage medium, a condition characteristic associated with the respective portion of the storage medium, a read type associated with the respective portion of the storage medium, and location(s) associated with the respective portion of the storage medium.

Figure 3A:
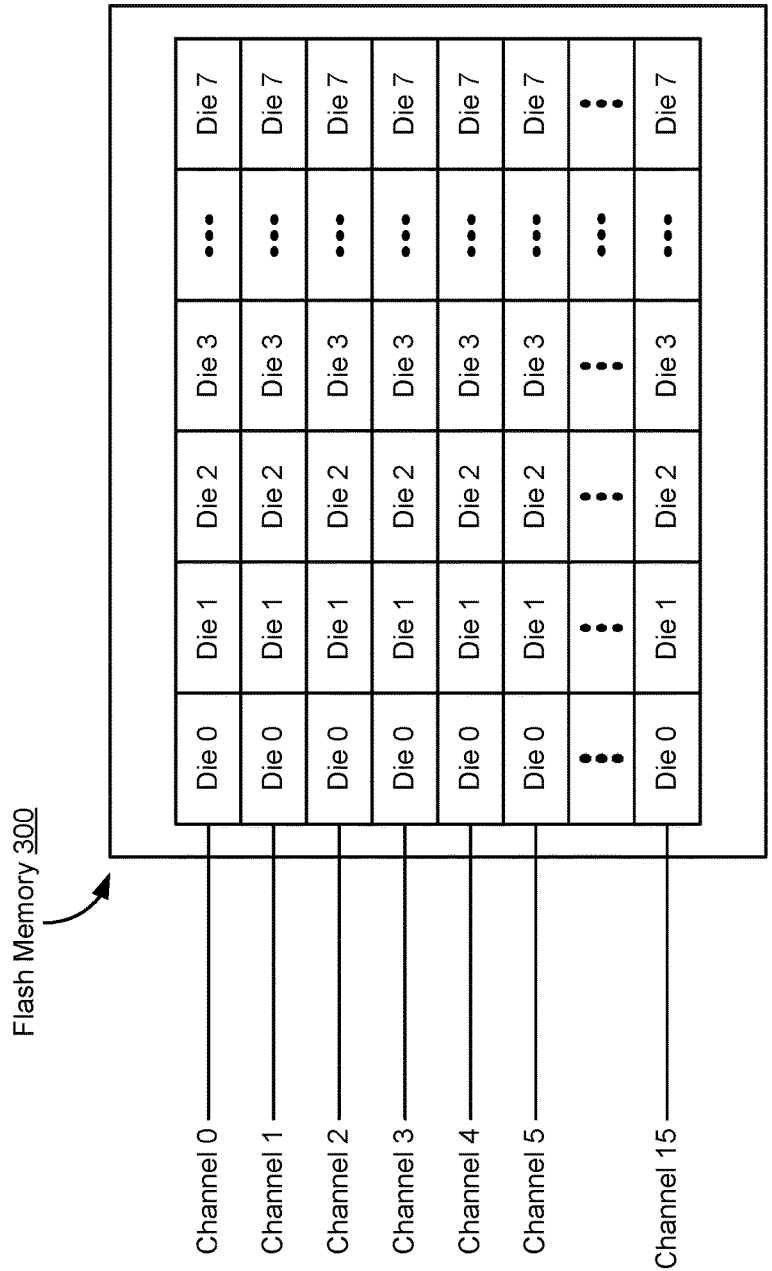
FIG. 3A is a schematic diagram of flash memory in accordance with some embodiments.

FIG. 3A is a schematic diagram of flash memory in accordance with some embodiments. In some embodiments, storage controller 122 is communicatively coupled to storage medium 130 (e.g., flash memory comprising one or more flash memory devices each comprising a plurality of die) via a set of channels (e.g., connections 103, FIG. 1A). In FIG. 3A, 16 channels communicatively couple flash memory 300 (e.g., a flash memory device with 128 die) to storage controller 122. In FIG. 3A, a subset of the plurality of die (e.g., 8 die) of flash memory 300 are connected to each channel. In this way, storage controller 122 is configured to perform memory operations on 16 die in parallel by utilizing the 16 channels. In some embodiments, the die are physically soldered to a channel and each die is connected to only one channel.

Figure 3B:
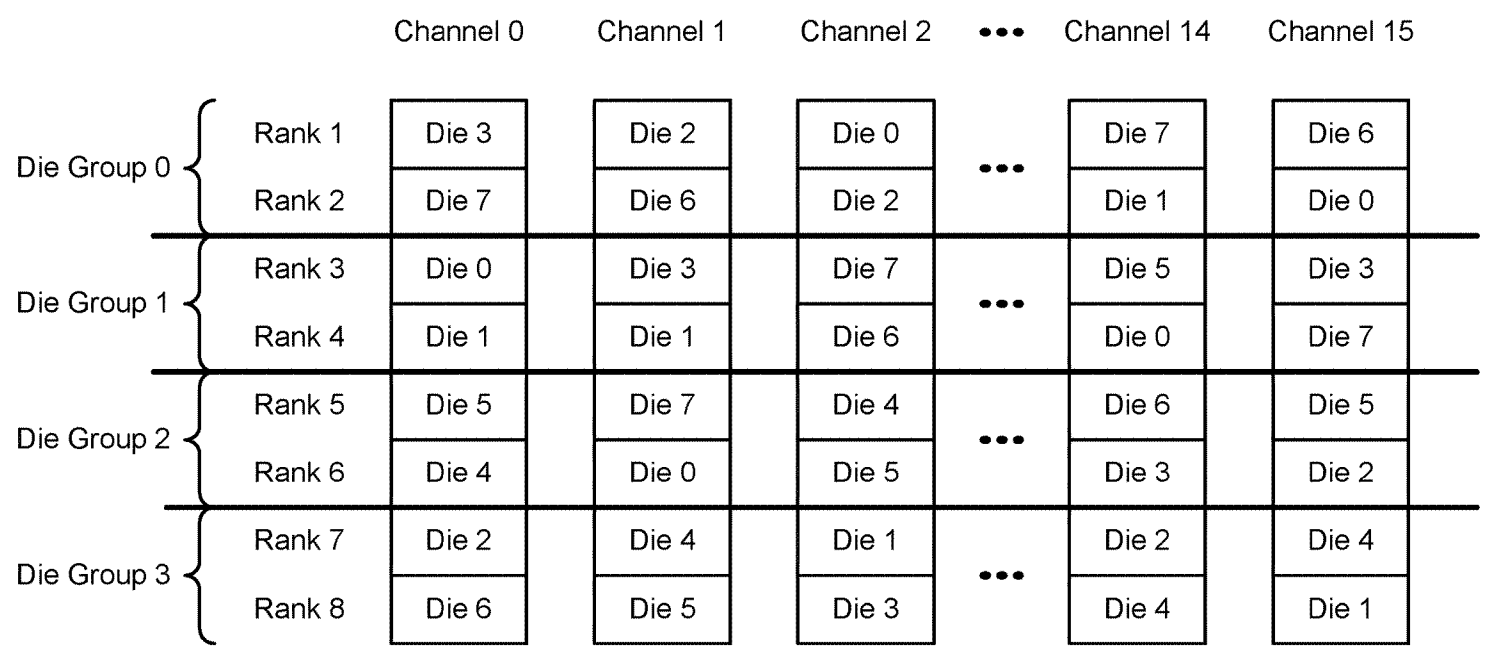

FIG. 3B is a block diagram of a plurality of die groups in accordance with some embodiments. As was the case in FIG. 3A, in FIG. 3B, flash memory comprises a plurality of die (e.g., 128 die) and the plurality of die are divided into subsets (e.g., 8 die per subset), where each subset of die is connected to a channel (e.g., one of 16 channels).

For example, prior to ordinary operational use, a calibration routine is run on a representative block from each die of flash memory, which simulates end of life conditions. For example, the BER for data read from a representative block of the respective die measured after a predefined number of PE cycles are performed on the representative block is the endurance metric. In another example, the total number of PE cycles performed on the representative block of the respective die when the BER for data read from the representative block meets or exceeds a predefined threshold is the endurance metric. In some embodiments, the endurance metric (e.g., a BER or number of PE cycles) for a respective die is stored in endurance metric field 242 of characterization vector 236 associated with the respective die.

In some embodiments, storage controller 122 or a component thereof (e.g., endurance metric module 214, FIG. 2A) is configured to obtain an endurance metric for each die from characterization vector table 234, and storage controller 122 or a component thereof (e.g., ranking module 216, FIG. 2A) is configured to rank the die in each channel based on their corresponding endurance metrics. In FIG. 3B, the 8 die in channel 0 are ranked from highest to lowest. With respect to channel 0, die 3 is the highest ranked die (e.g., rank 1) because the endurance metric associated with die 3 is higher than the other die in channel 0. With respect to channel 0, die 6 is the lowest ranked die (e.g., rank 8) because the endurance metric associated with die 6 is lower than the other die in channel 0.

In some embodiments, storage controller 122 or a component thereof (e.g., grouping module 218, FIG. 2A) is configured to group the plurality of die in the flash memory device into die groups based on their corresponding rankings. In some embodiments, one or more die in each channel is assigned to a die group, where the die assigned to a respective die group have a rank, or range of ranks, corresponding to the respective die group, and each die group has a distinct corresponding rank or range of ranks. In FIG. 3B, the die in each channel with ranks 1-2 (e.g., die 3 and 7 in channel 0, and die 6 and 0 in channel 15) are assigned to die group 0, the die in each channel with ranks 3-4 (e.g., die 0 and 1 in channel 0, and die 3 and 7 in channel 15) are assigned to die group 1, the die in each channel with ranks 5-6 (e.g., die 5 and 4 in channel 0, and die 5 and 2 in channel 15) are assigned to die group 2, and the die in each channel with ranks 7-8 (e.g., die 2 and 6 in channel 0, and die 4 and 1 in channel 1) are assigned to die group 3.

In some embodiments, storage controller 122 or a component thereof is configured to group the plurality of die in the flash memory device into die groups based on their corresponding endurance metrics, such that the die in each die group have similar endurance metrics (i.e., have endurance metrics that satisfy predefined similarity criteria). For example, in some embodiments, the die in each die group all have endurance metrics in a corresponding range of the endurance metric. As a result, in some implementations, the die assigned to any particular die group include unequal numbers of die from the various channels. For example, if on channel (e.g., a first channel) has a greater number of die in the endurance metric range corresponding to a particular die group than another channel (e.g., a second channel), the particular die group will include a greater number of die from the first channel than the second channel.

Figure 3C:
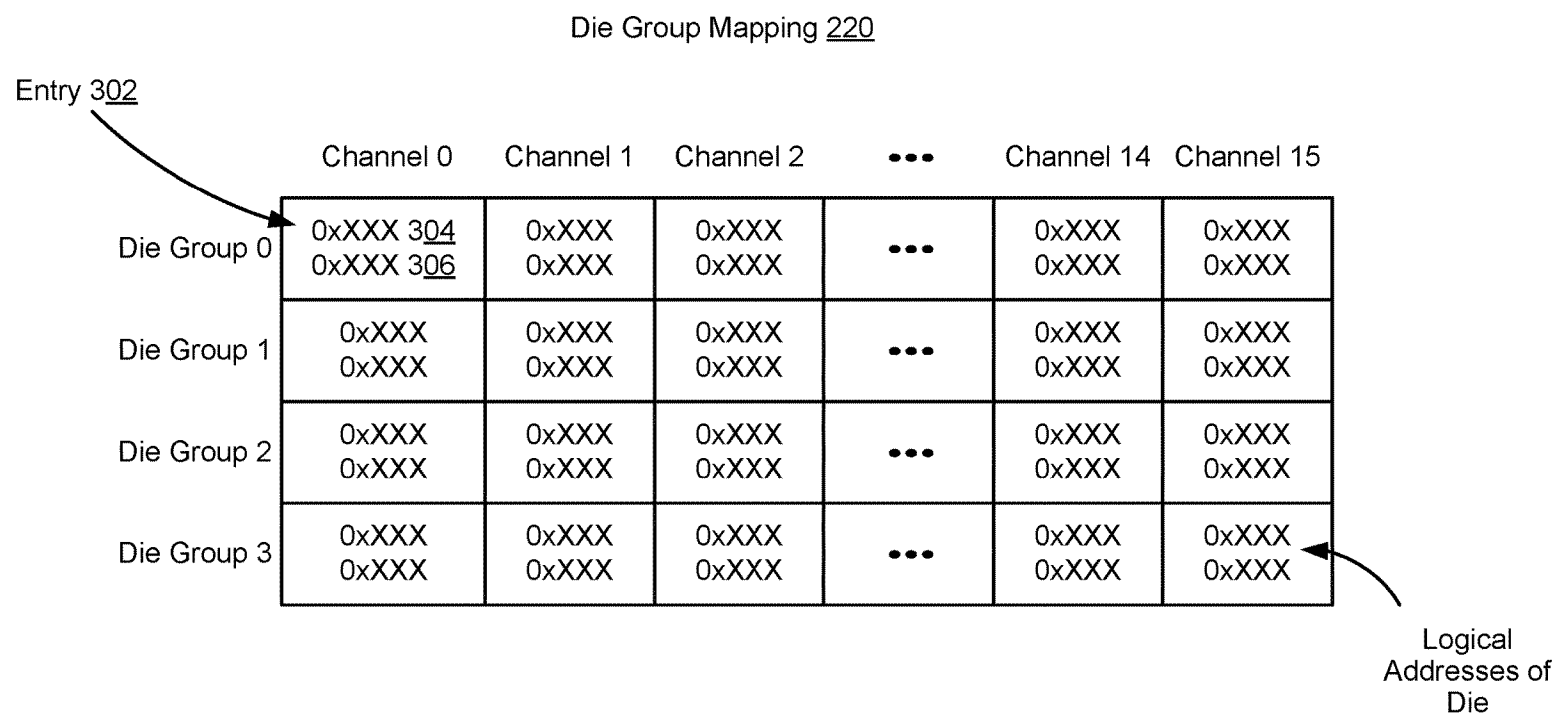

FIG. 3C is a diagram of a die group mapping corresponding to the plurality of die groups in FIG. 3B in accordance with some embodiments. In some embodiments, die group mapping 220 is stored in storage controller memory and includes the logical address (or range of logical addresses, or a representation thereof) for die assigned to each die group. In FIG. 3C, die group mapping 220 associates the logical address (or range of logical addresses) for all die in channels 0-15 with their assigned die groups. In FIG. 3C, the logical addresses for die 3 and 7 in channel 0 (e.g., logical addresses 304 and 306, respectively) are included in entry 302 associated with die group 0.

Figure 4A:
FIG. 4A is a block diagram of a die block mapping in accordance with some embodiments.

FIG. 4A is a diagram of die blocks mapping into metablocks across multiple die in accordance with some embodiments. FIG. 4A illustrates an example where metablocks 100-104 include only useable blocks at default positions in their respective die (e.g., all the blocks in each metablock 100-104 have the same index position within their respective die, i.e., die 1, 2, 3 or 4), and there is no pairing of these metablocks. FIG. 4A further illustrates that metablocks 107 and 108 are a pair because they share block 407. In this example, block 408 (not shown in FIG. 4A) cannot be part of a metablock because it is an unusable block. An unusable block may be one that was damaged during a manufacturing process or one that was determined to be unusable based on a later characterization. Further, in this example, metablocks 106 and 109 are paired because they share blocks 306 and 406, and metablocks 105 and 110 are paired because they share blocks 205, 305 and 405.

In some embodiments, as illustrated in FIG. 4A, paired metablocks share one or more blocks. Further, in some embodiments, each metablock that would otherwise be missing one or more blocks, is paired with a single other metablock, all of whose blocks are useable. However, although not illustrated in FIG. 4A, in some other embodiments, metablocks may be paired with multiple other metablocks if the shared blocks are within different metablocks.

In some embodiments, metablocks are formed according to endurance metrics (e.g., a BER or number of PE cycles) of the plurality of blocks, so that blocks with the same or similar endurance metrics are grouped into a metablock. Further, in some embodiments, metablock pairing will also be performed according to endurance metrics (e.g., a BER or number of PE cycles) of the plurality of blocks that make up a metablock. For example, in FIG. 4A, if the blocks that make up metablocks 106 and 109 have the same or similar endurance metrics, they may be paired for that reason. In some embodiments, the blocks in each metablock are metablocks from the same die group. As explained above with reference to FIGS. 3A-3C, in some embodiments, the die in each die group have similar endurance metrics.

In some embodiments, metablock pairing is dynamic. For example, metablocks 107 and 108 are paired at one time (as illustrated in FIG. 4A), sharing block 407, but at another, later time, metablock 108 is paired with metablock 104, sharing block 404, which is not illustrated in FIG. 4A.

FIG. 4B illustrates a metablock data structure, in accordance with some embodiments. In some embodiments, metablock data structure 226 is stored in storage controller memory and includes information for the metablocks being managed. For example, in FIG. 4B, the metablock data structure 226 includes metablock information such as metablock structure address (i.e., indicating a location or record within the metablock data structure 226), metablock ID (i.e., an identifier of the metablock), block ID (e.g., a list of blocks), valid count, paired metablock, and the current list for each of the metablocks in the metablock data structure. In this example, for any respective metablock, the paired metablock field identifies the metablock record in metablock data structure 226 for the other metablock, if any, paired with the respective metablock, and has a null or other default value if the respective metablock is unpaired.

In some embodiments, the valid count in the metablock data structure 226 represents the amount of valid data (e.g., the number of pages of valid data) that a metablock is holding. For example, in FIG. 4B, metablock 105, with a valid count of 0, holds no valid data. In some embodiments, the valid count of one of the metablocks in a pair sharing one or more blocks will be increased when the other metablock in the pair sharing one or more blocks is written to. For example, if metablock 107 is written to, its valid count will increase by a value corresponding to the amount of valid data written to it. If metablock 108 is paired to metablock 107, its valid count will increase by a value corresponding to the amount of valid data written to the one or more blocks that are shared by metablocks 107 and 108.

In some embodiments, the valid count of one of the metablocks in a pair sharing one or more blocks will be decreased when the other metablock in the pair sharing one or more blocks is garbage collected. For example, if metablock 107 is garbage collected, its valid count will return to 0 because there is no more valid data in it. If metablock 108 is paired to metablock 107, its valid count will decrease by a value corresponding to the amount of valid data garbage collected from the one or more blocks that are shared by metablocks 107 and 108.

In some embodiments, the current list in the metablock data structure 226 represents which of the free, open, and closed lists a metablock is currently on. In some embodiments, the free list includes metablocks with no valid data (i.e., having a valid count of 0), the open list includes metablocks that are selected as the metablocks currently "open" for being written to (and thus may have been partially written), and the closed list includes metablocks that are not available for writing data to. In some embodiments, the closed list will include metablocks that are fully written to. In some embodiments, if one of the metablocks in a pair sharing one or more blocks is on the open list, the other metablock in the pair sharing one or more blocks is on the closed list. For example, as illustrated in FIG. 4B, metablock 107 is on the open list and as a result, metablock 108, which shares block 407, is on the closed list. In another example that is not illustrated in FIG. 4B, metablock 107 is moved to the closed list after it is fully written to (i.e., valid count is at its maximum), and as a result metablock 108 is eligible to be moved to the open list.

FIG. 4C illustrates a data structure for storing metadata, including valid data counts, for respective memory portions (e.g., blocks, sometimes called erase blocks) in a non-volatile memory device or system, in accordance with some embodiments. In some embodiments, the metadata is included in a physical to logical mapping 238, which maps physical addresses in storage medium 130 to logical addresses (e.g., logical addresses used by a host computer system), and is stored at storage controller 122 or remote from storage controller 122. Physical to logical mapping 238 is typically indexed or keyed by physical addresses assigned to or associated with blocks of physical memory in storage medium 130, and includes a set of records 440, each for mapping one or more physical addresses to corresponding logical addresses and optionally, one or more metadata values, as shown in FIG. 4C.

In some embodiments, as illustrated in FIG. 4C, other information for the respective memory portions is also stored with the logical to physical mapping. For example, in some embodiments in which the respective memory portions are blocks, the metadata includes one or more of: a PE count, indicating a number of program/erase cycles for the block; a valid count, indicating an amount of valid data in the block; one or more read counts, indicating a number of read operations performed on the block, or respective portions of the block, since the block was last erased; etc. In some embodiments, one or more of the metadata types shown in FIG. 4C are stored in a data structure separate from physical to logical mapping 238, such as a separate table or the like for storing valid counts for respective blocks.

It is noted that the organization of non-volatile memory blocks, such as flash memory blocks, into metablocks, and forming metablock pairs to enable the use of blocks that would otherwise be prevented from inclusion in any metablock, increases the amount of useable memory in the storage device. As a result, over-provisioning (e.g., quantity or percentage of total storage capacity that is in excess of the declared capacity of the storage device) is increased, which in turn reduces write-amplification, and improves device endurance.

Write amplification is a phenomenon where the actual amount of physical data written to a storage medium (e.g., storage medium 130 in storage device 120) is a multiple of the logical amount of data written by a host (e.g., computer system 110, sometimes called a host) to the storage medium. When a block of storage medium must be erased before it can be re-written, the garbage collection process to perform these operations results in re-writing data one or more times. This multiplying effect increases the number of writes required over the life of a storage medium, which shortens the time it can reliably operate. The formula to calculate the write amplification of a storage system is given by equation:

$$\frac{\text{amount of data written to a storage medium}}{\text{amount of data written by a host}}$$

One of the goals of any flash memory based data storage system architecture is to reduce write amplification as much as possible so that available endurance is used to meet storage medium reliability and warranty specifications. Higher system endurance also results in lower cost as the storage system may need less over-provisioning. By reducing write amplification, through the use of metablock pairs, the endurance of the storage medium is increased and the overall cost of the storage system is decreased.

Figure 5A:
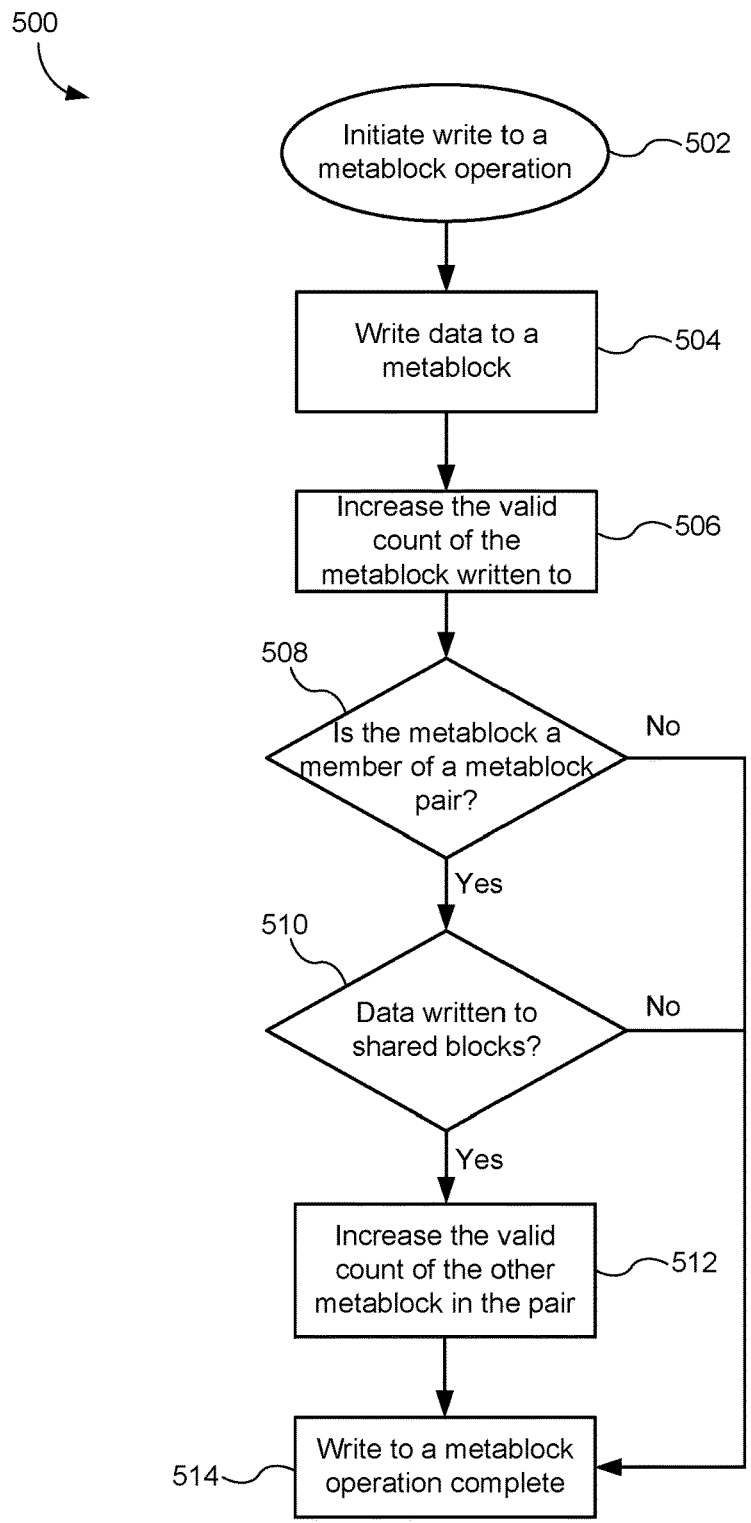
FIG. 5A illustrates a conceptual flowchart representation of a method of writing data to a metablock in a memory device, in accordance with some embodiments.

FIG. 5A illustrates a conceptual flowchart representation of a method of writing data to a metablock in a memory device and updating the valid counts of affected metablocks, in accordance with some embodiments. With reference to the data storage system 100 pictured in FIG. 1A, in some embodiments, a method 500 is performed by a storage device (e.g., storage device 120, FIG. 1A) or one or more components of the storage device (e.g., storage controller 122). In some embodiments, the method 500 is governed by instructions that are stored in a non-transitory computer-readable storage medium and that are executed by one or more processors of a device, such as the one or more processing units (CPUs) 129-1 of management module 121-1 (FIG. 2).

In some embodiments, some of the operations (or alternatively, steps) of method 500 are performed at a host system (e.g., computer system 110) that is operatively coupled with the storage device, and other operations of method 500 are performed at the storage device. In some of these embodiments, method 500 is governed, at least in part, by instructions that are stored in a non-transitory computer-readable storage medium and that are executed by one or more processors (e.g., hardware processors) of the host system (the one or more processors of the host system are not shown in FIG. 1A).

For ease of explanation, the following describes method 500 as performed by the storage device (e.g., by storage controller 122 of storage device 120, FIG. 1A). With reference to FIG. 2A, in some embodiments, the operations of method 500 are performed, at least in part, by a data write module (e.g., data write module 208, FIG. 2A), and a metablock module (e.g., metablock module 224, FIG. 2A). As shown in FIG. 2A, the metablock module may include a metablock data structure (e.g., metablock data structure 226, FIG. 2A).

The method begins, in some embodiments, when the storage device (e.g., storage device 120, FIG. 1A, or a component thereof such as data write module 208, FIG. 2A) performs a write operation (502). In some embodiments, the storage device performs the write operation on a portion (e.g., selectable portion 131 of storage medium 130, FIG. 1A) of one or more non-volatile memory devices (e.g., NVM 134-1, NVM 134-2, etc. of storage medium 130, FIG. 1A).

In some embodiments, the storage device writes data to a metablock (504) and increases the valid count (e.g., the valid count stored in metablock data structure 226, FIG. 4B) of the metablock to which the data was written (506). The storage device also determines if the metablock written to is a member of a metablock pair (508). If the metablock is not paired, the write to a metablock operation is complete (514). If the metablock is paired, the storage device determines if the data was written to any blocks shared between the metablock pair (510). If the data was not written to any shared blocks, the write operation is complete (514). But, if the blocks written to are shared, the valid count of the other metablock in the pair (i.e., the metablock not written to) is increased by a value corresponding to the shared blocks to which data was written to (512). After the valid count is increased, and potentially any other metadata updates (e.g., incrementing one or more write disturb counts) associated with the write operation have been made, the write operation is complete (514).

For example, with reference to FIG. 4A, if unpaired metablock 100 is written to, the valid count of metablock 100 is increased by a value corresponding to the amount of data written to the set of blocks in metablock 100, but the valid counts of the other metablocks (e.g., metablocks 101-110) are unchanged because they are not paired to metablock 100.

In another example, with reference to FIG. 4A, if metablock 107, which shares block 407 and is paired to metablock 108, is written to, the valid count of metablock 107 is increased by a value corresponding to the amount of data written to the set of blocks in metablock 107, and the valid count of metablock 108 is increased by a value corresponding to the amount of data written to shared block 407. In this example, if metablocks 107 and 108 have, respectively, valid counts of 75% and 0% of the maximum valid count, and if metablock 108 is subsequently fully written to so that its valid count increases to 100% of the maximum valid count, the valid count of metablock 107 is also increased to 100% of the maximum valid count, because shared block 407 is now fully written to. However, if metablock 108 is only partially written to, the valid count of metablock 107 is either increased or unchanged depending on whether shared block 407 was written to. In this way the amount of data written to a shared block is accounted for in the valid counts of each of the metablocks that share the block.

Figure 5B:
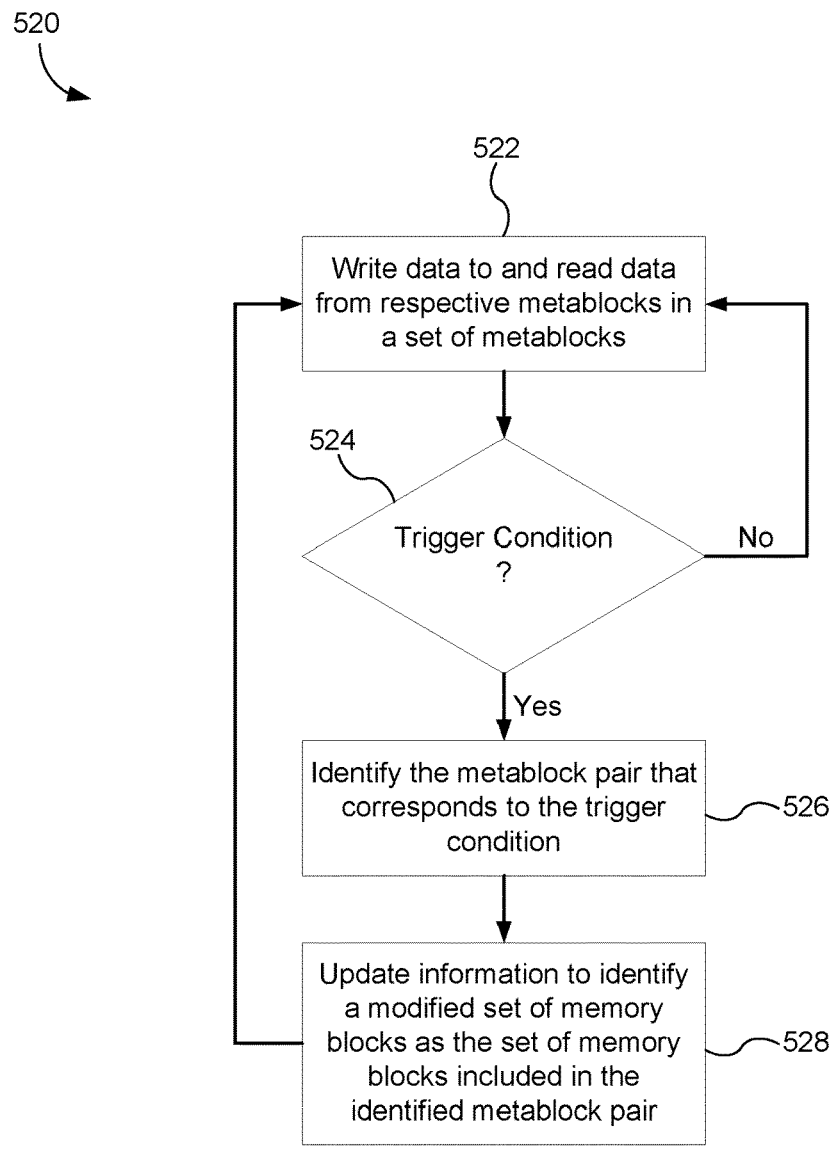
FIG. 5B illustrates a conceptual flowchart representation of a method of managing blocks that are grouped to make metablock pairs, in accordance with some embodiments.
Figure 6A:
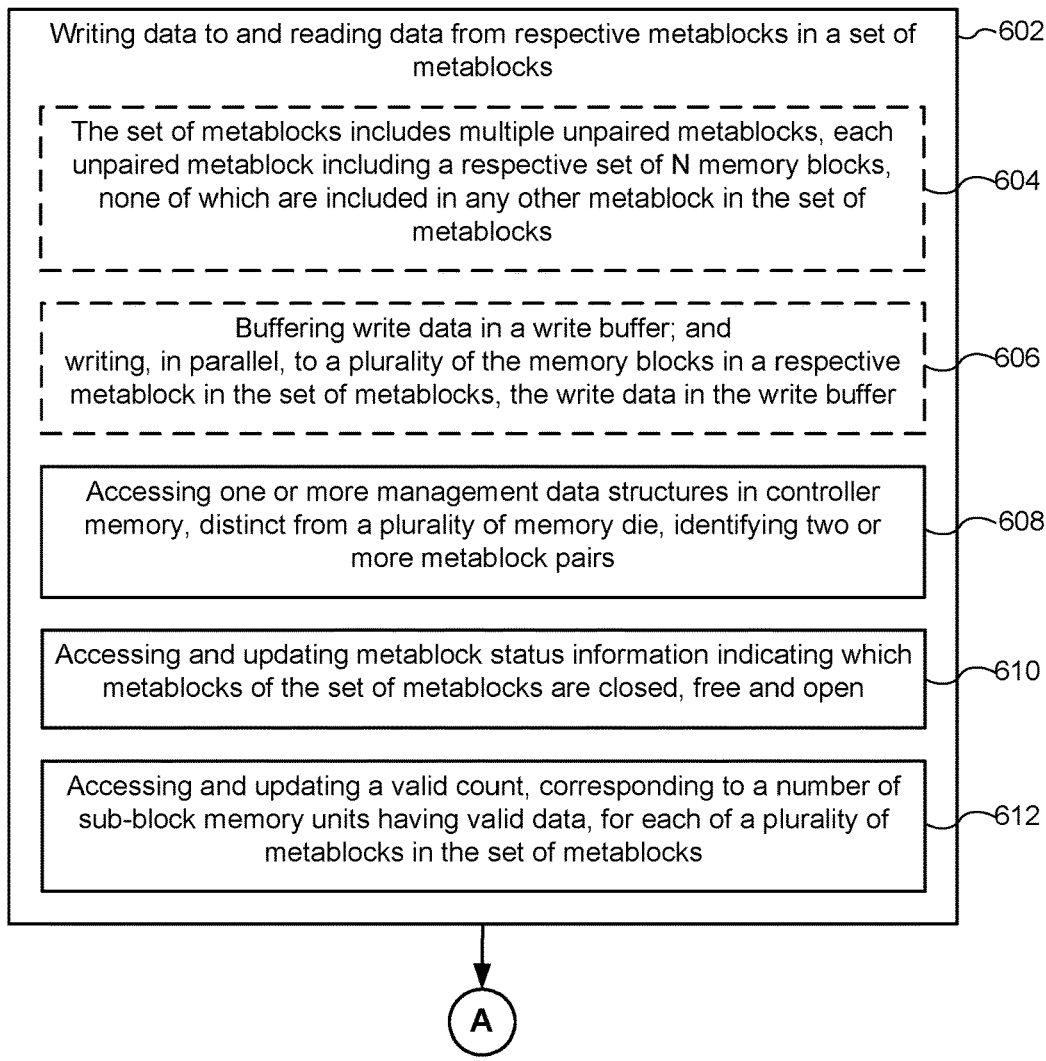
FIGS. 6A-6F illustrate a flowchart representation of a method of managing a storage system in accordance with some embodiments.
Figure 6B:
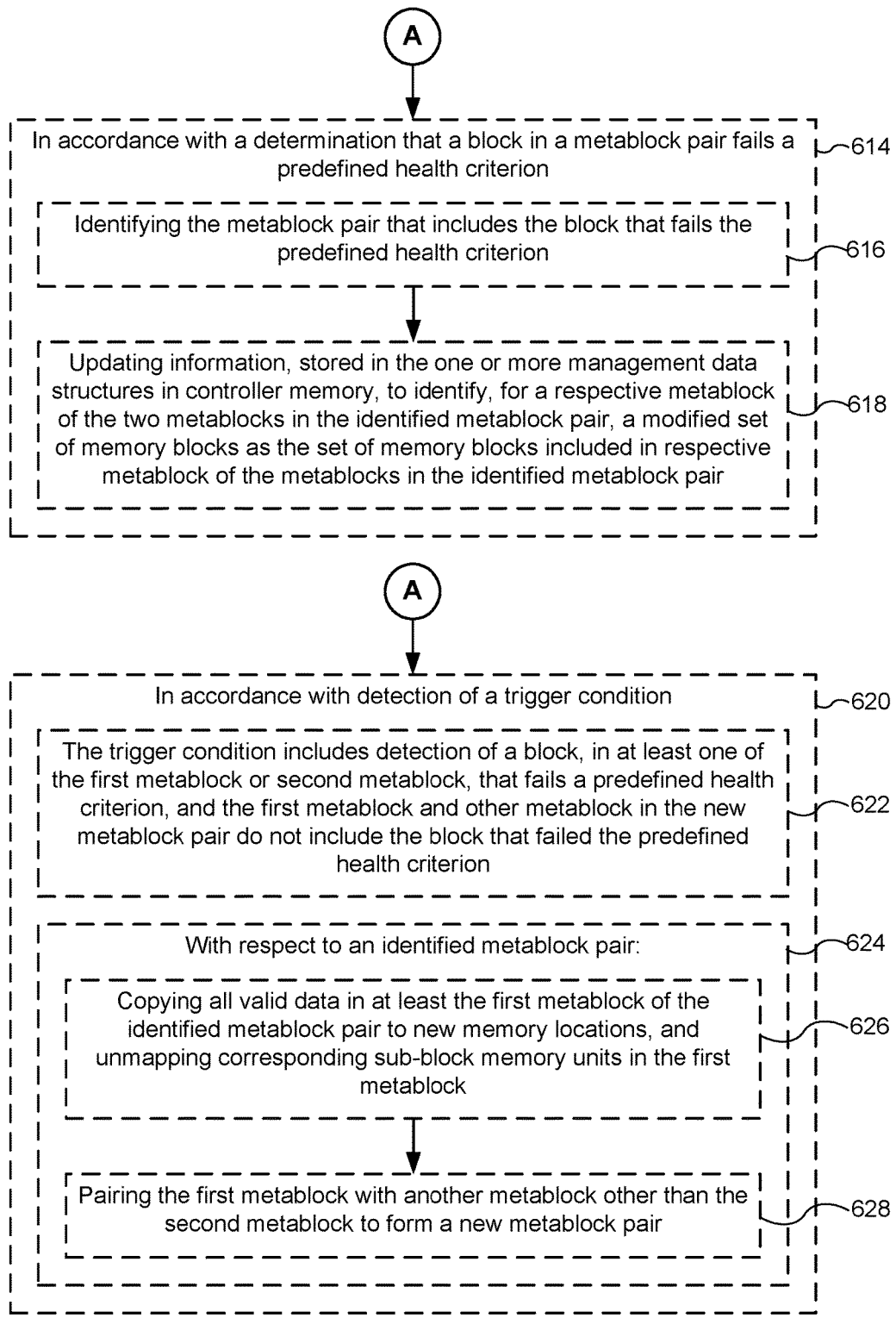
Figure 6C:
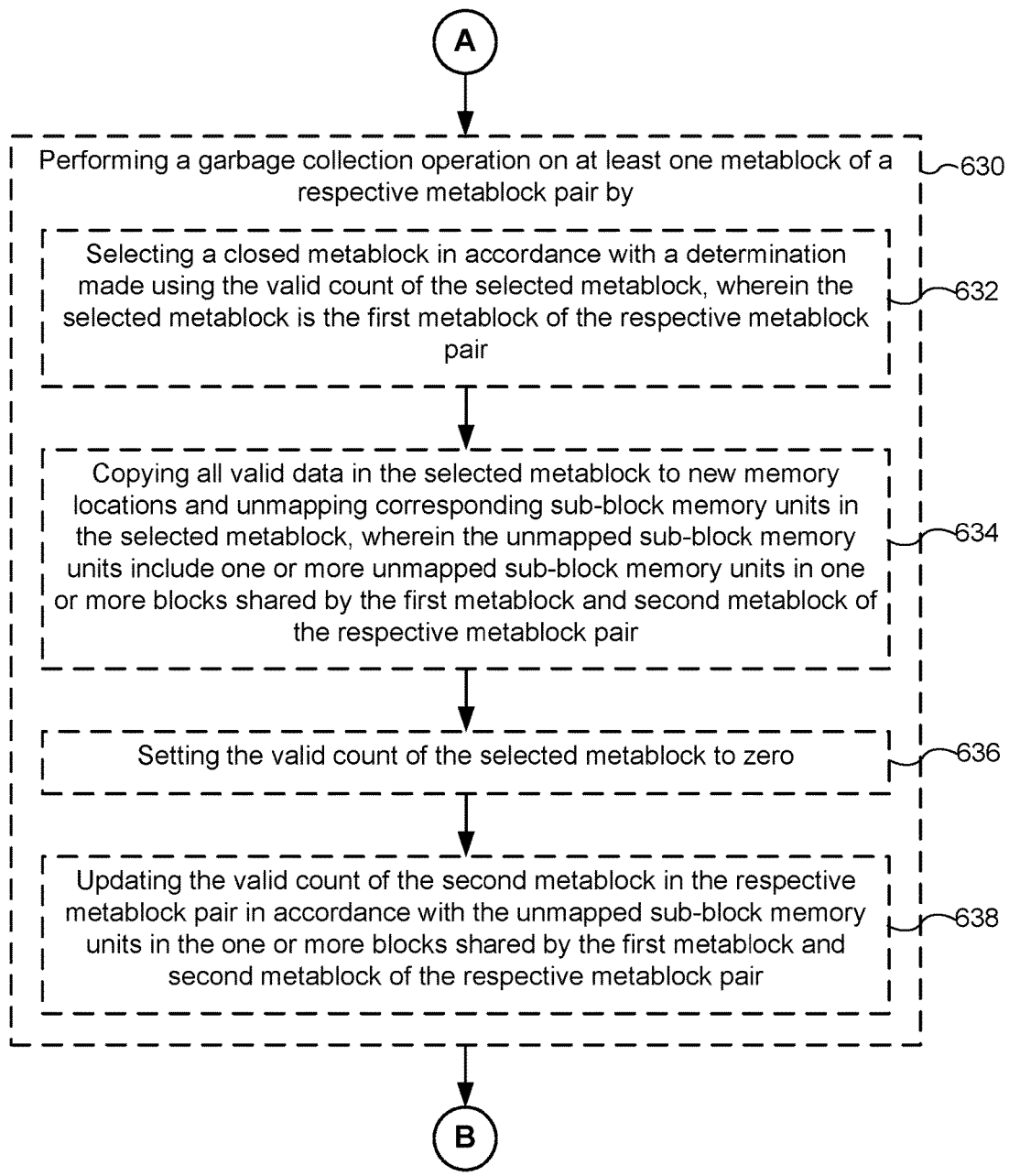
Figure 6D:
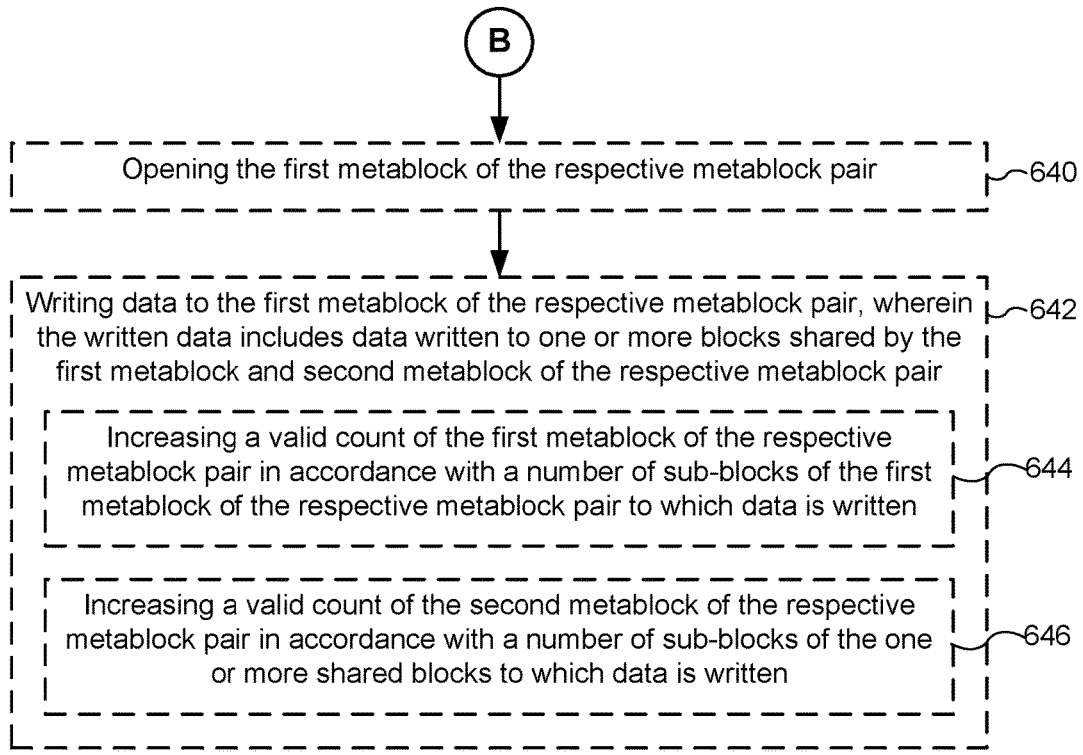
Figure 6E:
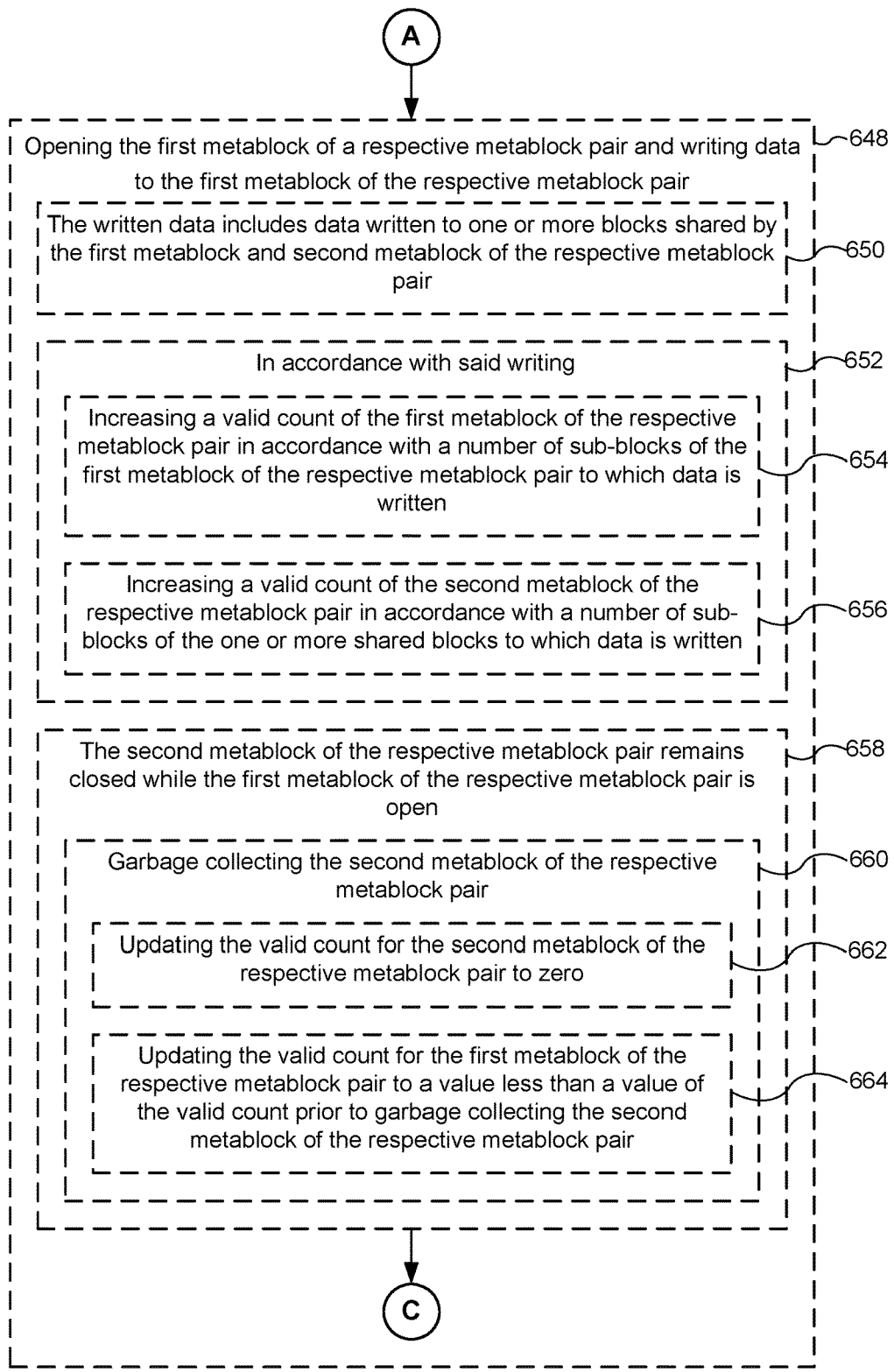
Figure 6F:
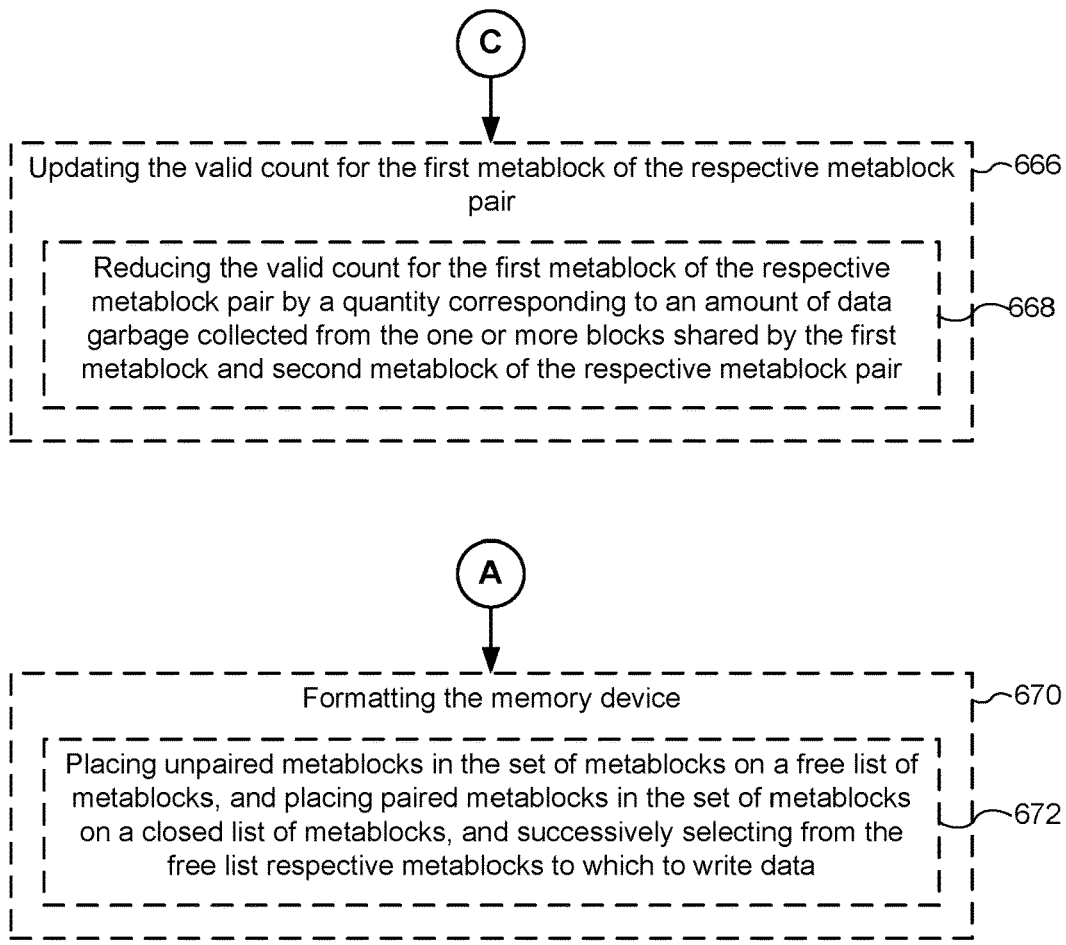

FIG. 5B illustrates a conceptual flowchart representation of a method of managing memory blocks that are grouped to make metablock pairs, in accordance with some embodiments. With reference to the data storage system 100 pictured in FIG. 1A, in some embodiments, a method 520 is performed by a storage device (e.g., storage device 120, FIG. 1A) or one or more components of the storage device (e.g., storage controller 122). In some embodiments, the method 520 is governed by instructions that are stored in a non-transitory computer-readable storage medium and that are executed by one or more processors of a device, such as the one or more processing units (CPUs) 129-1 of management module 121-1 (FIG. 2).

In some embodiments, some of the operations (or alternatively, steps) of method 520 are performed at a host system (e.g., computer system 110) that is operatively coupled with the storage device, and other operations of method 520 are performed at the storage device. In some of these embodiments, method 520 is governed, at least in part, by instructions that are stored in a non-transitory computer-readable storage medium and that are executed by one or more processors (e.g., hardware processors) of the host system (the one or more processors of the host system are not shown in FIG. 1A).

For ease of explanation, the following describes method 520 as performed by the storage device (e.g., by storage controller 122 of storage device 120, FIG. 1A). With reference to FIG. 2A, in some embodiments, the operations of method 520 are performed, at least in part, by a data write module (e.g., data write module 208, FIG. 2A), a data read module (e.g., data read module 206, FIG. 2A), and a metablock module (e.g., metablock module 224, FIG. 2A). As shown in FIG. 2A, the metablock module may include a metablock data structure (e.g., metablock data structure 226, FIG. 2A).

In some embodiments, the storage device writes data to and reads data from respective metablocks in a set of metablocks (522) until a trigger condition (524) is detected. In some embodiments, a trigger condition is detected when one or more endurance metrics of a memory block shared between a metablock pair exceed a predefined threshold. For example, if the PE count of the shared memory block exceeds a predefined threshold, or if the BER of the shared memory block exceeds a predefined threshold (e.g., a shared memory block becomes unusable), a trigger condition is detected. In some embodiments, the trigger condition is detected each time the PE count exceeds any threshold in a set of predefined thresholds, such as integer multiples of Z PE counts (e.g., integer multiples of 50 PE counts or 100 PE counts).

In some embodiments, a trigger condition (524) is detected when one or more endurance metrics of the set of memory blocks in one metablock of a pair are different from one or more endurance metrics of the set of memory blocks in the other metablock of a pair. For example, if the average PE count of memory blocks in one metablock of a pair is higher than the average PE count of blocks in the other metablock of a pair by a predefined margin, a trigger condition is detected.

In some embodiments, a trigger condition (524) is detected when one or more endurance metrics of a memory block within a metablock are different from the one or more endurance metrics of the other memory blocks within the metablock by a predefined margin. For example, if the PE count of a memory block (e.g., a shared block) within a metablock exceeds the average PE count of the memory blocks within the metablock by the predefined margin (e.g., by 20 or 50 PE counts), a trigger condition is detected.

In some embodiments, in accordance with a trigger condition (524) being detected, the storage device identifies the metablock pair that corresponds to the trigger condition (526), and updates information to identify a modified set of memory blocks as the set of memory blocks included in the identified metablock pair (528). In some embodiments, the updated information is stored in the metablock data structure (226) and replaces the previous values identifying the previous set of memory blocks included in the identified metablock pair.

In some embodiments, identifying a modified set of memory blocks (528) includes, for an identified metablock pair, identifying a first metablock of the identified metablock pair that has no unusable blocks and removing that first metablock from the metablock pair; identifying a third metablock, currently unpaired, with endurance metrics that satisfy predefined criteria (e.g., having endurance metrics that differ from those of the second metablock by less than a predefined threshold, or that differ from those of the second metablock by no more than the endurance metrics of any other metablock that is eligible for being paired with the second metablock); and pairing the identified third metablock with the second metablock. Further, when forming a new metablock pair, the set of memory blocks included in the new metablock pair excludes all blocks known to be unusable. Typically, at the conclusion of this process, the identified first metablock is unpaired. However, in the unusual case that both metablocks of a metablock pair have unusable blocks (e.g. because one of those blocks recently became unusable), the first and second metablocks of the pair are unpaired, and each is paired with another metablock having endurance metrics that satisfy the predefined criteria.

In some embodiments, each time two metablocks are paired (e.g., in operation 528), the metablocks selected to be included in the pair are selected from metablocks in the same die group. As explained above with reference to FIGS. 3A-3C, in some embodiments, the die in each die group have similar endurance metrics.

For example, with reference to FIG. 4A, if Block 407, which is initially shared between paired metablocks 107 and 108, is identified to have an endurance metric exceeding a predefined threshold (e.g., a PE count that exceeds the average PE count of the unshared blocks by a predefined margin), metablock 107 (which contains Block 407) is removed from the pair. Metablock 108 is then paired with a different metablock having memory blocks with endurance metrics that meet predefined criteria. In this way memory blocks shared between two metablocks in a metablock pair, which will get approximately twice as many PE cycles as the other memory blocks in the metablock pair so long as those memory blocks are shared by the two metablocks, are removed from a metablock pair when their endurance metrics exceed a predefined threshold, and new metablock pairs are formed using shared blocks with endurance metrics that meet predefined criteria. As a result, the extra wear on shared memory blocks caused by metablock pairing is spread across many metablocks over the lifetime of the storage device.

In some embodiments, identifying a modified set of memory blocks (528) includes identifying a memory block within a metablock with one or more endurance metrics different from the other memory blocks within the metablock by at least a predefined margin, removing the identified memory block from the set of memory blocks in the metablock, and including a different memory block with the same or similar endurance metrics as the set of memory blocks in the metablock. For example, with reference to FIG. 4A, if a metablock is formed from memory blocks 103, 201, 307, and 400 (not illustrated in FIG. 4A), and memory block 400 is found to have a PE count higher than the PE counts of memory blocks 103, 201, and 307 by a predefined margin (e.g., 20 or 50 PE cycles), memory block 400 is removed from the metablock, and a memory block with endurance metrics the same or similar to memory blocks 103, 201, and 307 (e.g., PE counts that differ by no more than 10 PE cycles) is added to the metablock. In this way, memory blocks within a metablock that have endurance metrics that are significantly different from the other memory blocks within the metablock are removed and replaced by memory blocks with the same or similar endurance metrics.

FIGS. 6A-6F illustrate a flowchart representation of a method 600 of managing a storage system that includes a storage controller and flash memory, the flash memory including one or more flash memory devices each including a plurality of die and each die including a plurality of blocks. In some embodiments, method 600 is performed by storage controller 122 or one or more components of storage controller 122 (e.g., management module 121-1, FIGS. 1A and 2A). In some embodiments, method 600 is governed by instructions that are stored in a non-transitory computer readable storage medium and the instructions are executed by one or more processors of storage controller 122, such as one or more processing units (CPUs) 129-1 of management module 121-1.

Optionally, as shown in FIG. 1B, in some embodiments the flash memory devices in the storage system are organized in a plurality of memory channels (e.g., 16 channels) communicatively coupled to storage controller 122. In some embodiments, each channel is communicatively coupled with a respective subset of the plurality of flash memory die (e.g., 8 or 16 die per channel).

In some embodiments, some of the operations (or alternatively, steps) of method 600 are performed at a host system (e.g., computer system 110) that is operatively coupled with the storage device, and other operations of method 600 are performed at the storage device. In some of these embodiments, method 600 is governed, at least in part, by instructions that are stored in a non-transitory computer-readable storage medium and that are executed by one or more processors (e.g., hardware processors) of the host system (the one or more processors of the host system are not shown in FIG. 1A).

For ease of explanation, the following describes method 600 as performed by the storage device (e.g., by storage controller 122 of storage device 120, FIG. 1A). With reference to FIG. 2A, in some embodiments, the operations of method 600 are performed, at least in part, by a data write module (e.g., data write module 208, FIG. 2A), a data read module (e.g., data read module 206, FIG. 2A), and a metablock module (e.g., metablock module 224, FIG. 2A). As shown in FIG. 2A, the metablock module may include a metablock data structure (e.g., metablock data structure 226, FIG. 2A).

With reference to FIGS. 6A-6F, in some embodiments, the storage device (e.g., storage device 120, FIG. 1A, or a component thereof such as data read module 206, or data write module 208, FIG. 2A) performs (602) operations of writing data to and reading data from respective metablocks in a set of metablocks. While said operations of writing and reading data are performed, operations accessing one or more management data structures (e.g., metablock data structure 226, FIG. 2A), identifying two or more metablock pairs (608) are also performed. Also while said operations of writing and reading data are performed, operations accessing and updating metablock status information (610) indicating which metablocks of the set of metablocks are closed, free and open are performed. Further, while said operations of writing and reading data are performed, operations accessing and updating a valid count (612), corresponding to a number of sub-block memory units (e.g., word lines or pages) having valid data for each of a plurality of metablocks in the set of metablocks, are performed.

In some embodiments, the set of metablocks includes multiple unpaired metablocks (604), each unpaired metablock including a respective set of N memory blocks, none of which are included in any other metablock in the set of metablocks.

In some embodiments, prior to writing data to the respective metablocks in a set of metablocks (602), the storage device buffers (606) write data in a buffer, and in accordance with a determination that the buffer contains a predefined amount of data, writes, in parallel, to a plurality of the memory blocks in a respective metablock in the set of metablocks, the write data in the write buffer. For example, with reference to FIG. 1A, storage controller 122 receives a host write command via control line 111 and a set of write data via data connections 101 from computer system 110 (e.g., a host). In response to the host write command, storage controller 122 or a component thereof (e.g., data write module 208, FIG. 2A) is configured to write data to the non-volatile memory by writing, in parallel, the write data to the plurality of memory blocks in a respective metablock in the set of metablocks.

In some embodiments, in accordance with a determination (614) that a block in a metablock pair fails a predefined health criterion, the storage device identifies the metablock pair that includes the block that fails the predefined health criterion (616). Further the storage device updates information (618), stored in the one or more management data structures (e.g., metablock data structure 226, FIG. 2A) in controller memory to identify, for a respective metablock of the two metablocks in the identified metablock pair, a modified set of memory blocks as the set of memory blocks included in the respective metablock of the metablocks in the identified metablock pair. The modified set of memory blocks includes only memory blocks that do not fail any predefined health criterion, and does not include the failed memory block that previously was included in the metablock pair.

In some embodiments, in accordance with detection of a trigger condition (620), the storage device performs operations with respect to an identified metablock pair (624), including copying all valid data in at least the first metablock of the identified metablock pair to new memory locations, unmapping corresponding sub-block memory units in the first metablock (626), and pairing the first metablock with another metablock other than the second metablock to form a new metablock pair (628). In some embodiments, the trigger condition includes detection of a block, in at least one of the first metablock or second metablock, that fails a predefined health criterion, and the first metablock and other metablock in the new metablock pair do not include the block that failed the predefined health criterion (622). In some embodiments pairing the first metablock with another metablock other than the second metablock to form a new metablock pair (628) includes updating information stored in one or more management data structures (e.g., metablock data structure 226, FIG. 2A) in controller memory including, setting the valid count of the first metablock to zero after copying all its valid data to new memory locations, updating the block IDs representing the set of blocks included in at least the first metablock of the new metablock pair, and updating the current list representing whether each of the metablocks of the new metablock pair is on the open list, free list, or closed list. Updating the pairings of metablocks is also discussed above with reference to operation 528 of FIG. 5B.

In some embodiments, pairing the first metablock with another metablock other than the second metablock (628) is performed in such a way that the endurance metrics of the memory blocks in the new metablock pair have similar values.

In some embodiments pairing of the first metablock with another metablock other than the second metablock (628) is performed according to the type of valid data that is or will be stored in the new metablock pair. For example, the type of data may be "hot" (changing frequently), "cold" (changing infrequently), or any type in between.

In some embodiments, the storage device performs a garbage collection operation on at least one metablock of a respective metablock pair (630). In some embodiments, the garbage collection operation is performed by first selecting a metablock on the closed list in accordance with a determination made using the valid count of the selected metablock, where the selected metablock is the first metablock of the respective metablock pair (632). The garbage collection operation further includes copying (634) all valid data in the first metablock to new memory locations and unmapping corresponding sub-block memory units in the selected metablock. The unmapped sub-block memory units include one or more unmapped sub-block memory units in one or more blocks shared by the first metablock and second metablock of the respective metablock pair (634). This is followed by setting the valid count of the first metablock to zero (636), and updating the valid count of the second metablock in the respective metablock pair in accordance with the unmapped sub-block memory units in the one or more blocks shared by the first metablock and second metablock of the respective metablock pair (638).

In some embodiments, a respective metablock in a metablock pair that is garbage collected is moved from the closed list to the free list or open list, if the other metablock in the metablock pair is on the closed list. In some embodiments, a metablock in a metablock pair that is garbage collected remains on the closed list if the other metablock in the metablock pair is on the free list. In some embodiments, if both metablocks in a metablock pair are garbage collected simultaneously, one metablock will be placed on either the free list or open list, and the other will be placed on the closed list. Furthermore, in some embodiments, a metablock is moved to the free list only after it has been garbage collected and its blocks have all been erased; but in some other embodiments, a metablock is moved to the free list after it has been garbage collected, even if its blocks have not yet been erased.

In some embodiments, after performing garbage collection on the at least one metablock of the respective metablock pair, the storage device opens the first metablock of the respective metablock pair (640); writes data to the first metablock of the respective metablock pair (642), where the written data includes data written to one or more blocks shared by the first metablock and second metablock of the respective metablock pair; increases a valid count of the first metablock (644) of the respective metablock pair in accordance with a number of sub-blocks of the first metablock of the respective metablock pair to which data is written; and increases a valid count of the second metablock (646) of the respective metablock pair in accordance with a number of sub-blocks of the one or more shared blocks to which data is written. Further discussion regarding writing data to a metablock in a pair of metablocks is found above in the discussion of FIG. 5A.

In some embodiments, the storage device opens the first metablock of a respective metablock pair and writes data to the first metablock of the respective metablock pair (648), where the written data includes data written to one or more blocks shared by the first metablock and second metablock of the respective metablock pair (650). As discussed above with reference to FIG. 5A, in accordance with the writing of data to the first metablock (652), the storage device increases a valid count of the first metablock (654) of the respective metablock pair in accordance with a number of sub-blocks of the first metablock of the respective metablock pair to which data is written, and increases a valid count of the second metablock (656) of the respective metablock pair in accordance with a number of sub-blocks of the one or more shared blocks to which data is written.

In some embodiments, the second metablock of a respective metablock pair remains closed while the first metablock of the respective metablock pair is open (658), and the second metablock of the respective metablock pair is garbage collected (660). After the second metablock of the respective metablock pair is garbage collected, the valid count for the second metablock of the respective metablock pair is updated to zero (662), and the valid count for the first metablock of the respective metablock pair is updated to a value less than a value of the valid count prior to garbage collecting the second metablock of the respective metablock pair (664).

In some embodiments, after the second metablock of a respective metablock pair is garbage collected, updating the valid count for the first metablock of the respective metablock pair (666) includes reducing the valid count for the first metablock of the respective metablock pair by a quantity corresponding to an amount of data garbage collected from the one or more blocks shared by the first metablock and second metablock of the respective metablock pair (668).

For example, with reference to FIG. 4A, metablocks 107 and 108 share block 407 and have, in this example, valid counts of 100% and 25% of the maximum valid count, respectively. If metablock 108 is garbage collected, the subsequent valid count of metablock 108 will be zero, and the subsequent valid count of metablock 107 will be a value reduced by a quantity corresponding to the amount of data garbage collected from block 407. In this example, if shared block 407 has all of its valid data garbage collected when metablock 108 is garbage collected, the valid count of metablock 107 decreases from 100% of the maximum valid count to 75% of the maximum valid count.

In some embodiments, in conjunction with formatting the memory device (670), unpaired metablocks in the set of metablocks are placed on a free list of metablocks, paired metablocks in the set of metablocks are placed on a closed list of metablocks, and metablocks are successively selected from the free list to write data to (672). In some embodiments, in conjunction with formatting the memory device (670), the valid counts of all metablocks are set to zero. For example, with reference to FIG. 4A, if the memory device is formatted, the valid counts of metablocks 100-110 are set to zero, unpaired metablocks 100-104 are placed on a free list of metablocks, and paired metablocks 105-110 are placed on a closed list of metablocks. Subsequently, the metablocks on the free list (in this example metablocks 100-104) are successively selected for writing data to.

It will be understood that, although the terms "first," "second," etc. may be used herein to describe various elements, these elements should not be limited by these terms. These terms are only used to distinguish one element from another. For example, a first die group could be termed a second die group, and, similarly, a second die group could be termed a first die group, which changing the meaning of the description, so long as all occurrences of the "first die group" are renamed consistently and all occurrences of the "second die group" are renamed consistently. The first die group and the second die group are both die groups, but they are not the same die group.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of data organization of a memory device, the memory device comprising:
   a plurality of memory die, each memory die including a plurality of memory blocks, each memory block including a plurality of memory pages; and
   a set of metablocks, each metablock including a specified set of N memory blocks in N different memory die, where N is an integer greater than 2, and the set of metablocks include two or more metablock pairs, each metablock pair including a first metablock and a second metablock that share one or more individual memory blocks;
   the method comprising:
   writing data to and reading data from respective metablocks in the set of metablocks;
   while performing said writing and reading, accessing one or more management data structures in controller memory, distinct from the plurality of memory die, identifying two or more metablock pairs;

accessing and updating metablock status information indicating which metablocks of the set of metablocks are closed, free and open; and accessing and updating a valid count, corresponding to a number of sub-block memory units having valid data, for each of a plurality of metablocks in the set of metablocks.

2. The method of claim 1, wherein the set of metablocks includes multiple unpaired metablocks, each unpaired metablock including a respective set of N memory blocks, none of which are included in any other metablock in the set of metablocks.

3. The method of claim 1, further including:
buffering write data in a write buffer; and
writing, in parallel, to a plurality of the memory blocks in a respective metablock in the set of metablocks, the write data in the write buffer.

4. The method of claim 1, further comprising, in accordance with a determination that a block in a metablock pair fails a predefined health criterion,
identifying the metablock pair that includes the block that fails the predefined health criterion; and
updating information, stored in the one or more management data structures in controller memory, to identify, for a respective metablock of the two metablocks in the identified metablock pair, a modified set of memory blocks as the set of memory blocks included in the respective metablock of the metablocks in the identified metablock pair.

5. The method of claim 1, further comprising, in accordance with detection of a trigger condition,
with respect to an identified metablock pair:
copying all valid data in at least the first metablock of the identified metablock pair to new memory locations, and unmapping corresponding sub-block memory units in the first metablock; and
pairing the first metablock with another metablock other than the second metablock to form a new metablock pair.

6. The method of claim 5, wherein the trigger condition includes detection of a block, in at least one of the first metablock or second metablock, that fails a predefined health criterion, and the first metablock and other metablock in the new metablock pair do not include the block that failed the predefined health criterion.

7. The method of claim 1, further comprising performing a garbage collection operation on at least one metablock of a respective metablock pair by:
selecting a closed metablock in accordance with a determination made using the valid count of the selected metablock, wherein the selected metablock is the first metablock of the respective metablock pair;
copying all valid data in the selected metablock to new memory locations and unmapping corresponding sub-block memory units in the selected metablock, wherein the unmapped sub-block memory units include one or more unmapped sub-block memory units in one or more blocks shared by the first metablock and second metablock of the respective metablock pair;
setting the valid count of the selected metablock to zero; and
updating the valid count of the second metablock in the respective metablock pair in accordance with the unmapped sub-block memory units in the one or more blocks shared by the first metablock and second metablock of the respective metablock pair.

8. The method of claim 7, further comprising, after performing the garbage collection operation on the at least one metablock of the respective metablock pair,
opening the first metablock of the respective metablock pair;
writing data to the first metablock of the respective metablock pair, wherein the written data includes data written to one or more blocks shared by the first metablock and second metablock of the respective metablock pair; and
in accordance with said writing:
increasing a valid count of the first metablock of the respective metablock pair in accordance with a number of sub-blocks of the first metablock of the respective metablock pair to which data is written; and
increasing a valid count of the second metablock of the respective metablock pair in accordance with a number of sub-blocks of the one or more shared blocks to which data is written.

9. The method of claim 1, further comprising,
opening the first metablock of a respective metablock pair;
writing data to the first metablock of the respective metablock pair, wherein the written data includes data written to one or more blocks shared by the first metablock and second metablock of the respective metablock pair; and
in accordance with said writing:
increasing a valid count of the first metablock of the respective metablock pair in accordance with a number of sub-blocks of the first metablock of the respective metablock pair to which data is written; and
increasing a valid count of the second metablock of the respective metablock pair in accordance with a number of sub-blocks of the one or more shared blocks to which data is written.

10. The method of claim 9, wherein the second metablock of the respective metablock pair remains closed while the first metablock of the respective metablock pair is open, the method further including:
garbage collecting the second metablock of the respective metablock pair, and,
in conjunction with garbage collecting the second metablock of the respective metablock pair,
updating the valid count for the second metablock of the respective metablock pair to zero, and
updating the valid count for the first metablock of the respective metablock pair to a value less than a value of the valid count prior to garbage collecting the second metablock of the respective metablock pair.

11. The method of claim 10, wherein updating the valid count for the first metablock of the respective metablock pair comprises reducing the valid count for the first metablock of the respective metablock pair by a quantity corresponding to an amount of data garbage collected from the one or more blocks shared by the first metablock and second metablock of the respective metablock pair.

12. The method of claim 1, further comprising, in conjunction with formatting the memory device, placing unpaired metablocks in the set of metablocks on a free list of metablocks, and placing paired metablocks in the set of metablocks on a closed list of metablocks, and successively selecting from the free list respective metablocks to which to write data.

13. A storage system, comprising:
- a plurality of memory die, each memory die including a plurality of memory blocks, each memory block including a plurality of memory pages; and
- a set of metablocks, each metablock including a specified set of N memory blocks in N different memory die, where N is an integer greater than 2, and the set of metablocks include two or more metablock pairs, each metablock pair including a first metablock and a second metablock that share one or more individual memory blocks;
- a controller having one or more processors and controller memory storing one or more programs, the one or more programs including instructions that when executed by the one or more processors cause the storage system to:
  - write data to and read data from respective metablocks in the set of metablocks; and
  - while performing said writing and reading,
    - access and update metablock status information indicating which metablocks of the set of metablocks are closed, free and open; and
    - access and update a valid count, corresponding to a number of sub-block memory units having valid data, for each of a plurality of metablocks in the set of metablocks.

14. The storage system of claim 13, wherein the one or more programs include a metablock module having instructions for managing the metablock pairs, including maintaining valid counts of valid data in the metablock pairs when data is written to either metablock of any metablock pair and when data is garbage collected from either metablock of any metablock pair.

15. The storage system of claim 13, wherein the set of metablocks includes multiple unpaired metablocks, each unpaired metablock including a respective set of N memory blocks, none of which are included in any other metablock in the set of metablocks.

16. The storage system of claim 13, wherein the one or more programs, when executed by the one or more processors, cause the storage system to:
- buffer write data in a write buffer; and
- write, in parallel, to a plurality of the memory blocks in a respective metablock in the set of metablocks, the write data in the write buffer.

17. The storage system of claim 13, wherein the one or more programs, when executed by the one or more processors, cause the storage system to perform a set of operations in accordance with a determination that a block in a metablock pair fails a predefined health criterion, the set of operations including:
- identifying the metablock pair that includes the block that fails the predefined health criterion; and
- updating information, stored in one or more management data structures in controller memory, to identify, for a respective metablock of the metablocks in the identified metablock pair, a modified set of memory blocks as the set of memory blocks included in the respective metablock of the metablocks in the identified metablock pair.

18. A non-transitory computer readable storage medium, storing one or more programs for execution by one or more processors of a storage system having one or more controllers, the one or more programs including instructions for:
- writing data to and reading data from respective metablocks in a set of metablocks;
- while performing said writing and reading,
  - accessing one or more management data structures in controller memory, distinct from a plurality of memory die, identifying two or more metablock pairs;
  - accessing and updating metablock status information indicating which metablocks of the set of metablocks are closed, free and open; and
  - accessing and updating a valid count, corresponding to a number of sub-block memory units having valid data, for each of a plurality of metablocks in the set of metablocks.

19. The non-transitory computer readable storage medium of claim 18, wherein the set of metablocks includes multiple unpaired metablocks, each unpaired metablock including a respective set of N memory blocks, none of which are included in any other metablock in the set of metablocks.

20. The non-transitory computer readable storage medium of claim 18, wherein the one or more programs, when executed by the one or more processors, cause the storage system to:
- buffer write data in a write buffer; and
- write, in parallel, to a plurality of the memory blocks in a respective metablock in the set of metablocks, the write data in the write buffer.

* * * * *